(12) United States Patent
Okawa et al.

(10) Patent No.: US 8,410,773 B2
(45) Date of Patent: Apr. 2, 2013

(54) SURGE CURRENT DETECTION DEVICE

(75) Inventors: Takayuki Okawa, Tokyo (JP);
Yasuharu Yamada, Tokyo (JP);
Hideyoshi Saeki, Tokyo (JP); Takuya Ouchi, Tokyo (JP)

(73) Assignee: Sankosha Corporation, Tokyo (JP)

( * ) Notice: Subject to any disclaimer, the term of this patent is extended or adjusted under 35 U.S.C. 154(b) by 467 days.

(21) Appl. No.: 12/880,545

(22) Filed: Sep. 13, 2010

(65) Prior Publication Data

US 2011/0121816 A1 May 26, 2011

(30) Foreign Application Priority Data

Nov. 24, 2009 (JP) .................................. 2009-266330

(51) Int. Cl.
*G01R 13/04* (2006.01)
(52) U.S. Cl. ........ 324/113; 324/263; 324/213; 324/219; 324/117 R; 324/252; 361/118; 361/93.1; 361/88; 361/65
(58) Field of Classification Search .................. 324/113, 324/263, 213, 214, 219, 252, 117 R; 361/118, 361/93.1, 88, 65, 254; 224/522
See application file for complete search history.

(56) References Cited

U.S. PATENT DOCUMENTS

| 4,706,016 | A | 11/1987 | Schweitzer, Jr. |
| 5,373,242 | A | 12/1994 | Joulie et al. |
| 5,583,429 | A * | 12/1996 | Otaka .......................... 324/127 |
| 6,713,671 | B1 * | 3/2004 | Wang et al. .................... 174/391 |
| 2004/0201374 | A1 * | 10/2004 | Kawase ...................... 324/117 R |
| 2010/0013457 | A1 * | 1/2010 | Nero, Jr. ...................... 324/119 |

FOREIGN PATENT DOCUMENTS

| FR | 970.979 A | 1/1951 |
| JP | 56-097879 A | 8/1981 |
| JP | 05-016578 A | 1/1993 |
| JP | 11-076801 A | 3/1999 |
| JP | 2005-150657 A | 6/2005 |
| JP | 2006-244889 A | 9/2006 |
| JP | 2007-242569 A | 9/2007 |

* cited by examiner

*Primary Examiner* — Huy Q Phan
*Assistant Examiner* — Thang Le
(74) *Attorney, Agent, or Firm* — Carrier Blackman & Associates, P.C.; Joseph P. Carrier; William D. Blackman

(57) ABSTRACT

A protection element (e.g., an arrester) protects a piece of equipment to be protected, from surge currents line terminals and an earth terminal. Surge current detection devices are provided on respective conductors connected to the arrester. Each of the surge current detection devices is to detect the surge current penetrated into a conductor for a short period of time, and includes a magnetic flux concentration member by which a magnetic flux produced by the penetrated surge current is concentrated in a given detection area at a high density, and a ferromagnetic material sheet positioned on the given detection area. The ferromagnetic material sheet includes a recording layer which is able to record and erase the penetration state of the surge current. A plurality of microcapsules are arranged in the recording layer, and each of the microcapsules contains a suitable liquid, and a plurality of magnetic particles suspended in the suitable liquid. An orientation state of the magnetic particles is varied by the concentrated magnetic flux, and can be visually recognized.

10 Claims, 18 Drawing Sheets

SURGE CURRENT DETECTION DEVICE

BACKGROUND ART

1. Field of the Invention

The present invention relates to a surge current detection device provided in a protector, which guards and protects a piece of equipment to be protected, such as a communication circuit unit, an electric power supply circuit unit and so on, from a surge current caused by a thunderbolt or the like and penetrated into conductors such as communication lines, power supply lines and so on, which are connected to the piece of equipment to be protected, and more particularly relates to such a surge current detection device for detecting a penetration state of the surge current by utilizing a magnetic field, which is generated around the conductors due to the penetration of the surge current thereinto.

2. Description of the Related Art

Recently, while a quality of a piece of equipment to be protected, such as a communication circuit unit, an electric power supply unit and so on are being improved, the number of damage cases, in which pieces of equipment to be protected are damaged by the thunderbolts or the like, are tending upward. For example, when a thunderbolt strikes a peripheral facility of a building, a surge current flows around a location at which the thunderbolt strikes. When the surge current penetrates into an interior of the peripheral facility, a piece of equipment to be protected may be damaged. Thus, a surge current detection device for detecting the penetration of the surge current is needed.

In order that the piece of equipment to be protected is not subjected to damage, a surge protection device (SPD), which may be referred to as a protector, is provided in the facility. However, even in the protector having a function of protecting the piece of equipment to be protected from the thunderbolt surge current, protection elements (i.e., thunderbolt protection elements) such as an arrester, a varistor and so on provided in the protector may be damaged. Thus, similar to the facility to be protected, a surge current detection device for detecting the penetration of the surge current is needed for the protectors.

In the protector, among others, the interior protection elements such as the varistor, the arrester and so on are inevitably subjected to a gradual deterioration due to applications of a surge current and a surge voltage thereto. Since the respective inherent functions of the deteriorated elements decline, it is important to prematurely exchange the deteriorated protector for a fresh one.

As prior arts for resolving the problems as mentioned above, prior art surge current detection devices are disclosed in, for example, the following Patent Documents 1 to 3:
[Patent Document 1]: JP-2005-150657 A
[Patent Document 2]: JP-2006-244889 A
[Patent Document 3]: JP-2007-242569 A In the surge current detection device disclosed in Patent Document 1, a degree of deterioration of a protection element such as a varistor is determined by changing a color of a heat sensitive material, using Joule heat caused by a surge current flowing through a conductor on a thunderbolt. In particular, the heat sensitive material is placed on the protection element such as the varistor, and the Joule heat is generated when the surge current flows through the protection element and when the protection element is operated, to thereby vary the color of the heat sensitive material.

In surge current detection devices disclosed in Patent Documents 2 and 3, similar to the aforesaid case, a determination method uses Joule heat, and a degree of deterioration of a protection element is determined by using a shrinkage of a metal composed of a heat-shrinkable material. For example, when the shrinkable metal material is shrunken due to the Joule heat of the surge current, the deterioration determination is carried out by using a mechanical mechanism which is made to expose the hidden degradation mark and can be viewed according to the shrinkage power.

Also, a technique of a magnetic displaying medium, which can visually confirms information contents of a card, and which, however, does not belong to the technical field of the protector concerned, is disclosed in the following Patent Document 4:
[Patent Document 4]: JP-H05-016578 A The magnetic displaying medium disclosed in Patent Document 4 includes a substrate having an information storage section and a magnetic display section provided thereon. The information storage section is formed of either a magnetic tape or an IC (integrated circuit) memory. The magnetic display section includes a substrate and a recording layer provided thereon. The recording layer is formed by directly coating the substrate with a plurality of microcapsules or by coating the substrate with the plurality of microcapsules through the intermediary of a suitable intermediate layer. Each of the microcapsules contains a suitable liquid, and a plurality of magnetic particles suspended in the liquid and easily affected by a magnetic field. The magnetic display section is constituted so that a piece of information can be visually displayed on the recording layer in accordance with information stored on the information storage section, and so that the displaced piece of information can be erased from the recording layer, if necessary.

Further, a technique concerning such microcapsules is disclosed in the following Patent Document 5:
[Patent Document 5]: JP-H11-076801 A Nevertheless, the prior art surge current detection devices, as disclosed in Patent Documents 1 to 3, have the following problems (a), (b) and (c) to be solved as mentioned hereinbelow:

(a) The prior art surge current detection devices utilize the Joule heat of the surge current flowing through the conductor in order to determine a degree of deterioration of the protection element such as the varistor, the arrester and so on. Since the surge current must quickly flow through the conductor, it is necessary to make a resistance of the conductor very small. For this reason, the surge current flows through the conductor for a very short period of time, and thus an amount of Joule heat is small, resulting in decline in a sensibility of deterioration detection.

(b) Since the prior art surge current detection devices utilizing the shrinkable metal material include the physical mechanism in which a degree of shrinkage of the shrinkable metal material is amplified so as to be able to be visually displayed, it is difficult to downsize these devices.

(c) In the prior art surge current detection devices utilizing the heat sensitive material and the shrinkable metal material, it is difficult or impossible to reuse these materials, and thus the used materials are put into the discard together with the protectors, to thereby waste the many resources.

In short, in the prior art surge current detection devices, there are the problems that the sensibility of deterioration detection is inferior, that it is difficult to downsize the devices, and that it is impossible to reuse the devices.

In order to solve these problems, for example, although it is considered that the recording layer composed of the microcapsules, as disclosed in Patent Documents 4 and 5, is applied to the prior art surge current detection devices to thereby detect the surge current, it is very difficult to increase the sensibility of deterioration detection because the surge current caused by the thunderbolt flows through the conductor for an extremely short period of time.

SUMMARY OF THE INVENTION

Therefore, the present invention aims at providing a surge current detection device which is constituted so that the aforesaid problems involved in the prior art surge current detection devices can be solved by using the prior art microcapsule technique.

In particular, a first object of the present invention is to provide a surge current detection device which is constituted so that a magnitude of a surge current penetrating into a conductor and a frequency of surge currents penetrating into the conductor can be simply and surely detected.

A second object of the present invention is to provide a surge current detection device which is safely constituted without utilizing dangerous Joule heat generation, which has a simple structure, and which can be easily downsized and compactly installed.

A third object of the present invention is to provide a surge current detection device which can be reset by using a magnet for a repeat of reuse, resulting in a decrease in production cost of the surge current detection device.

In order to carry out the first, second and third objects, a surge current detection device according to the present invention is provided on a conductor connected to a protection element for protecting a piece of equipment to be protected from a surge current penetrated into said conductor, and detects the penetration of the surge current into the conductor. The surge current detection device comprises: a magnetic flux concentration section that concentrates a magnetic flux, which defines a magnetic field generated by the surge current penetrated into said conductor, in a given detection area at a high density; and a ferromagnetic material sheet disposed over said detection area.

The ferromagnetic material sheet comprises: a sheet member having a rear surface and a front surface and disposed over the detection area so that the rear surface thereof is applied to the detection area; a recording layer provided on the front surface of the sheet member and including a plurality of microcapsules, each of which contains a suitable liquid, and a plurality of magnetic particles suspended in the suitable liquid, an orientation state of the magnetic particles being varied by the concentrated magnetic flux, whereby a penetration state of the surge current can be recorded and erased in the recording layer; and a transparent protective film covering the recording layer so that a recording state and an erasing state in the recording layer can be visually recognized.

In the surge current detection device according to the present invention, the magnetic flux defining the magnetic field generated by the surge current penetrating into the conductor is concentrated in the given detection area of the magnetic flux concentration section at a high density, so that an orientation state of the magnetic particles contained in the microcapsules of the ferromagnetic material sheet is varied. Accordingly, it is possible to visually and clearly recognize the variation of the orientation state of the magnetic particles even if a time of the penetration of the surge current is very short, and thus it is possible to simply and surely detect the magnitude of the surge current and the frequency of the surge current penetrations. As a result, the surge current detection device can be safely constituted without utilizing dangerous Joule heat generation. Further, since the ferromagnetic material sheet can be made to be close to the conductor by using the holder, the surge current detection device can have a simple structure, and can be easily downsized and compactly installed. In addition, since the orientation state of the magnetic particles can be easily reset by using a magnet, it is possible to repeatedly reuse the surge current detection device, resulting in a decrease in production cost of the surge current detection device.

The aforesaid objects, other objects and other novel features of the present invention are made known by the description of preferable embodiments referring to the drawings. It should be understood that the drawings are to assist an explanation of the present invention, and are not to limit the present invention.

DESCRIPTION OF THE PREFERRED EMBODIMENTS

With reference to the drawings, the embodiments of the present invention will now be explained below.

First Embodiment

Arrangement of the First Embodiment

Figure 1:
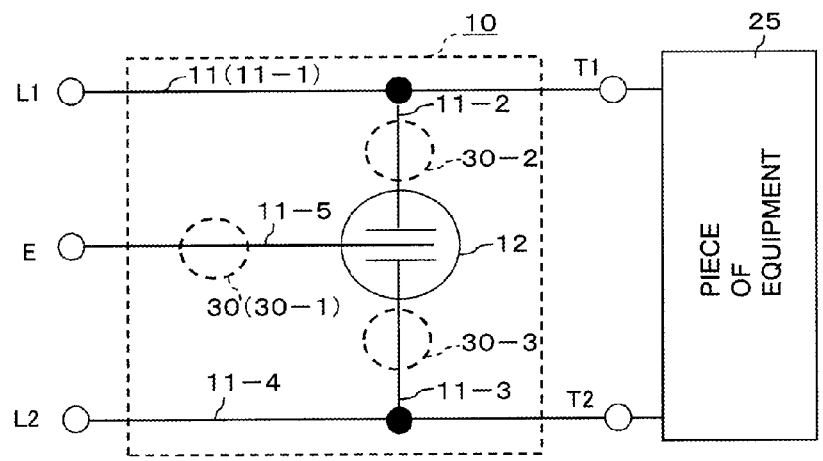
FIG. 1 is a circuit diagram of a protector in which surge current detection devices according to a first embodiment of the present invention are provided.
Figure 2:
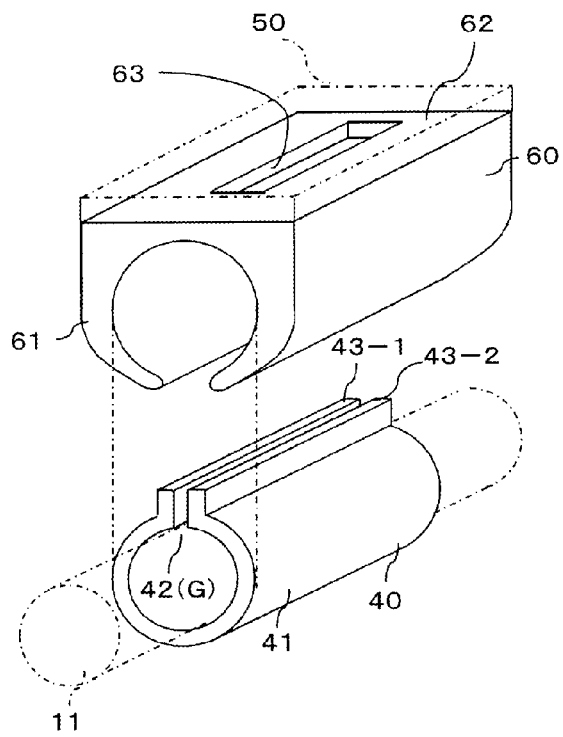
FIG. 2 is an exploded perspective view showing one of the surge current detection devices shown in FIG. 1.
Figure 3:
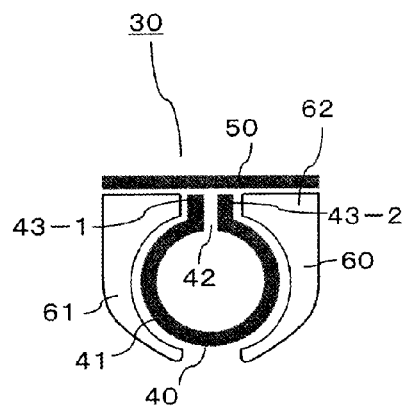
FIG. 3 is a cross-sectional view of the surge current detection device shown in FIG. 2.

FIG. 1 is a circuit diagram of a protector in which surge current detection devices according to a first embodiment of the present invention are provided; FIG. 2 is an exploded perspective view showing one of the surge current detection devices shown in FIG. 1; and FIG. 3 is a cross-sectional view of the surge current detection device shown in FIG. 2.

As shown in FIG. 1, a protector indicated by reference 10 protects a piece of equipment 25 to be protected, such as a piece of communication equipment, from a surge current caused by a thunderbolt or the like, and includes two respective line terminals L1 and L2 which are connected to a communication line and a power supply line, an earth terminal E which is grounded, and two equipment terminals T1 and T2 which are connected to the piece of equipment 25 to be protected. The line terminal L1 and the equipment terminal T1 are connected to each other through the intermediary of a conductor 11 (e.g., 11-1), and the line terminal L2 and the equipment terminal T2 are connected to each other through the intermediary of a conductor 11-4.

The conductor 11-1 is connected to a first electrode of a 3-pole arrester 12 through the intermediary of a line-to-line conductor 11-2, and a second electrode of the 3-pole arrester 12 is connected to the conductor 11-4 through the intermediary of a line-to-line conductor 11-3. A third electrode of the 3-pole arrester 12 is connected to the earth terminal E through the intermediary of an earth conductor 11-5. For each of the conductors 11-1 to 11-15, a cable is used, which has a circular cross-sectional shape, and a core diameter (e.g., 2.0 mm, 3.5 mm, 5.0 mm, 8 mm and so on) which is previously selected in accordance with a magnitude of current to be withstood.

A surge current detection device 30 (e.g., 30-1) is mounted on the earth conductor 11-5, and respective surge current detection devices 30-2 and 30-3 are further mounted on the line-to-line conductors 11-2 and 11-3. When a surge current is caused by a thunderbolt, and when it is penetrated into each of the conductor 11-2, 11-3 and 11-5, each of the surge current detection devices 30-1, 30-2 and 30-3 detects a penetration state of the surge current penetrated into a corresponding conductor 11-2, 11-3 or 11-5 (for example, a current-penetration path, a magnitude of the penetrated current, a frequency of the penetrated currents and so on). The surge current detection devices 30-1, 30-2 and 30-3 are identical to each other.

As shown in FIGS. 2 and 3, the surge current detection device 30 includes: a magnetic flux concentration section or member 40 for concentrating a magnetic flux, which defines a magnetic field generated by a surge current penetrated into the conductor 11, in a given detection area at a high density; a ferromagnetic material sheet 50 which is disposed over the detection area, and which is able to record and erase the penetration state of the surge current; and a holder 60 by which the magnetic flux concentration member 40 is held, and by which the ferromagnetic material sheet 50 is set and fixed to the detection area.

The magnetic flux concentration member 40 includes a cylindrical holder portion 41 for holding the conductor 11 having the circular cross-sectional shape. The cylindrical holder portion 41 is made of a monolithic ferromagnetic material (e.g., a ferromagnetic material such as iron oxide, chromium oxide, cobalt, ferrite and so on), and has a linear slit 42 axially extending and defining a gap G. This gap G has a function of defining the aforesaid detection area. In particular, the magnetic flux, which defines the magnetic field generated by the surge current penetrated into the conductor 11, is concentrated in the gap G at the high density, to thereby define the detection area. Also, the magnetic flux concentration member 40 includes a pair of opposite attachment portions 43-1 and 43-2 integrally protruded from both the sides of the linear slit 42.

The holder 60 is provided to set and fix the ferromagnetic material sheet 50 at a position at which the ferromagnetic material sheet 50 is opposed to the gap G of the magnetic flux concentration member 40, and includes: a holder portion 61 having a cylindrical groove formed therein, which receives and holds the magnetic flux concentration member 40; and an attachment portion 62 defining a bottom of the cylindrical groove of the holder portion 61 and having a flat surface to which a rear surface of the ferromagnetic material sheet 50 is adhered and fixed with a suitable adhesion agent or the like, with both the holder portion 61 and the attachment portion 62 being integrally formed of a suitable plastic material or the like. The attachment portion 62 has an elongated opening 63 formed therein, which receives in a fit-in manner the pair of opposite attachment portions 43-1 and 43-2 of the magnetic flux concentration member 40. The elongated opening 63 has not only a function of tightly receiving the pair of opposite attachment portions 43-1 and 43-2 of the magnetic flux concentration member 40 to thereby fix the magnetic flux concentration member 40 to the holder 60, but also a function of leading the magnetic flux, generated in the gap G of the magnetic flux concentration member 40, to the ferromagnetic material sheet 50.

Figure 4:
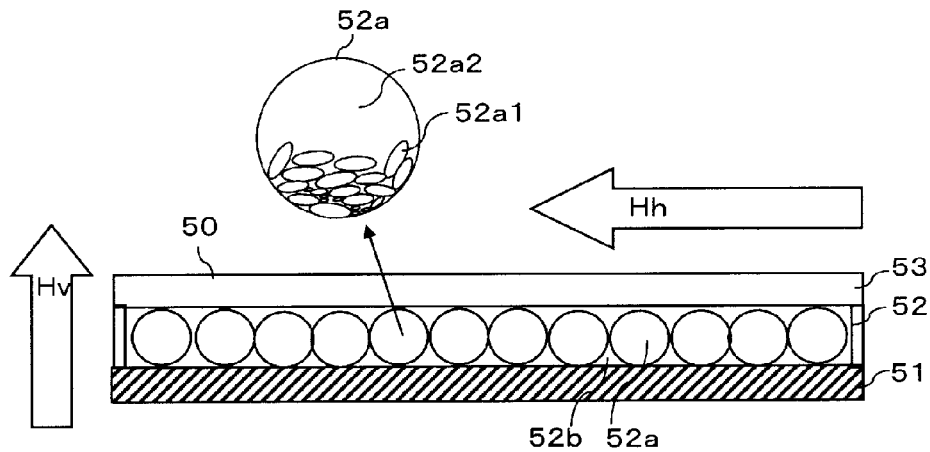
FIG. 4 is a schematic cross-sectional view of a ferromagnetic material sheet shown in FIGS. 2 and 3.
Figure 5:
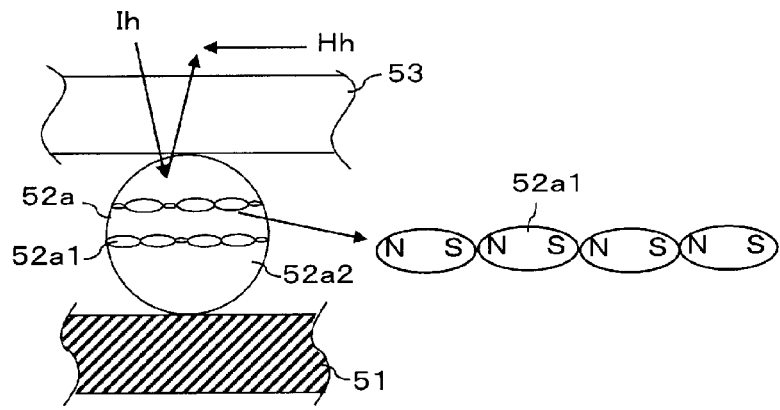
FIG. 5 is a partially-enlarged view of FIG. 4 to explain an operational principle of the ferromagnetic material sheet shown in FIG. 4.
Figure 6:
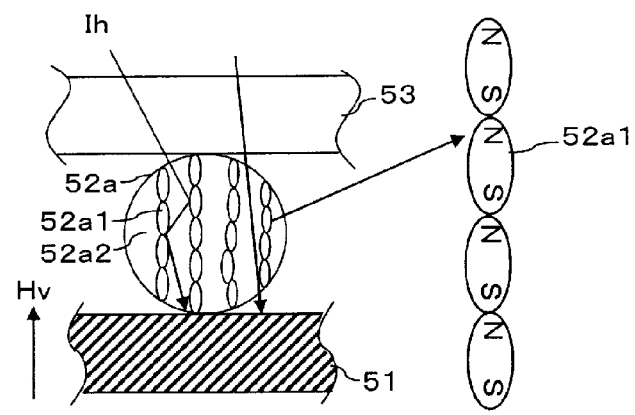
FIG. 6 is a partially-enlarged view similar to FIG. 5 to explain the operational principle of the ferromagnetic material sheet shown in FIG. 4.

FIG. 4 is a schematic cross-sectional view of a ferromagnetic material sheet shown in FIGS. 2 and 3; FIG. 5 is a partially-enlarged view of FIG. 4 to explain an operational principle of the ferromagnetic material sheet shown in FIG. 4; and FIG. 6 is a partially-enlarged view similar to FIG. 5 to explain another operational principle of the ferromagnetic material sheet shown in FIG. 4.

As shown in FIG. 4, the ferromagnetic material sheet 50 includes: a sheet member 51, a rear surface of which should be adhered to the flat surface of the attachment portion 62 of the holder 60; a recording layer 52 which is provided on a front surface of the sheet member 51, and which is able to record and erase a penetration state of the surge current; and a transparent protective film 53 or the like, with which the recording layer 52 is covered so that a recording state and an erasing state in the recording layer 52 can be visually recognized.

The sheet member 51 is made of a suitable plastic material, and is tinted with a suitable color so that a clear display contrast can be obtained in the recording layer 52. The rear surface of the sheet member 51 is adhered and fixed to the flat surface of the attachment portion 62 of the holder 60 with a suitable adhesion agent or the like.

The recording layer 52 is composed of a plurality of microcapsules 52a arranged over the front surface of the sheet member 51, and an adhesive or binder material 52b, with which the spaces among the microcapsules 52a are fulfilled. As disclosed in Patent Documents 4 and 5, each of the microcapsules 52a contains a plurality of magnetic particles 52a1, an orientation state of which varies by a magnetic flux, and a suitable liquid 52a2 such as an organic solvent or the like, in which the magnetic particles 52a1 are suspended, and has a spherical shape having a diameter falling within a range from about 10 μm to about 100 μm. In order to obtain the microcapsule 52a featuring a superior magnetic coercive force, the magnetic particles 52a1 should be prepared by mixing soft magnetic material particles, such as iron particles, exhibiting a small magnetic coercive force, with hard magnetic material particles, such as magnet material particles (e.g., ferrite, neodymium or the like), exhibiting a large magnetic coercive force. In particular, for example, the microcapsule 52a featuring the superior magnetic coercive force can be obtained by mixing flake-like soft magnetic material particles having a length/width ratio of about 10 to about 1 and having a diameter falling within a range between about 2 μm and 10 μm with about 3-15% flake-like hard magnetic material particles having a length/width ratio of about 5 to about 1 and having a diameter falling within a range between about 0.1 μm and 2 μm.

The transparent protective film 53 may be made of, for example, a transparent plastic sheet.

With the above-mentioned arrangement of the ferromagnetic material sheet 50, as shown in FIG. 5, for example, when a horizontal magnetic field Hh is generated in the ferromagnetic material sheet 50, the magnetic particles 52a1 are horizontally oriented and aligned with each other to define rows of the magnetic particles, so that incident lights Ih, which are made incident on the transparent protective film 53 from outside, are reflected by the rows of magnetic particles, and then are returned toward the transparent protective film 53. Thus, it is possible to observe a surface color of the magnetic particles 52a1 through the transparent protective film 53. Also, as shown in FIG. 6, when a vertical magnetic field Hv is generated in the ferromagnetic material sheet 50, the magnetic particles 52a1 are vertically oriented and aligned with each other to define columns of the magnetic particles, so that incident lights Ih, which are made incident on the transparent protective film 53 from outside, are repeatedly reflected between the columns of the magnetic particles, and then arrive on the front surface of the sheet member 51. Nevertheless, a major part of the incident lights cannot be returned toward the transparent protective film 53 due to the incident lights being repeatedly reflected between the columns of the magnetic particles. As a result, it is possible to observe a dark color through the transparent protective film 53 even if the sheet member 51 is tinted with, for example, either white or red.

(Operation of Protector of the First Embodiment)

Figure 7:
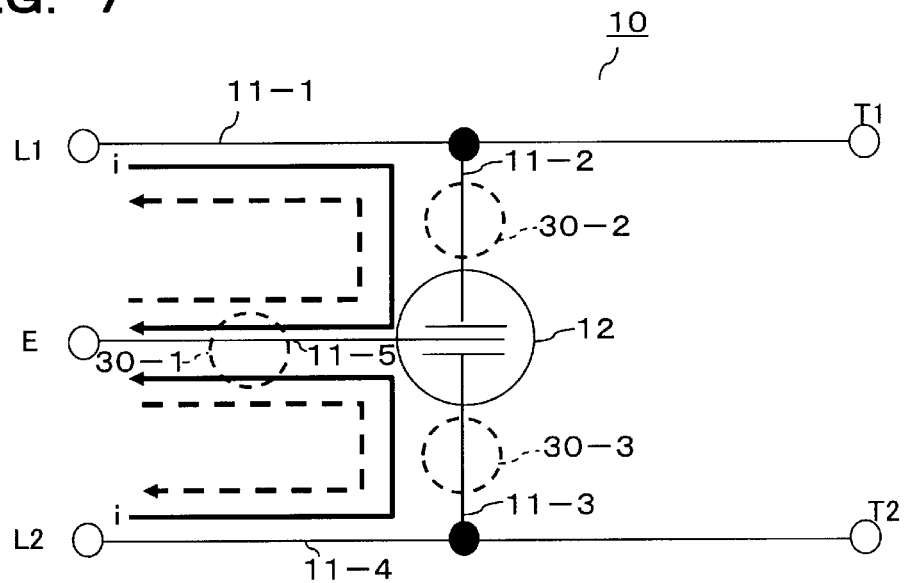
FIG. 7 is a circuit diagram for explaining an operation of the protector of FIG. 1 in a ground-to-line mode (i.e., a common mode)
Figure 8:
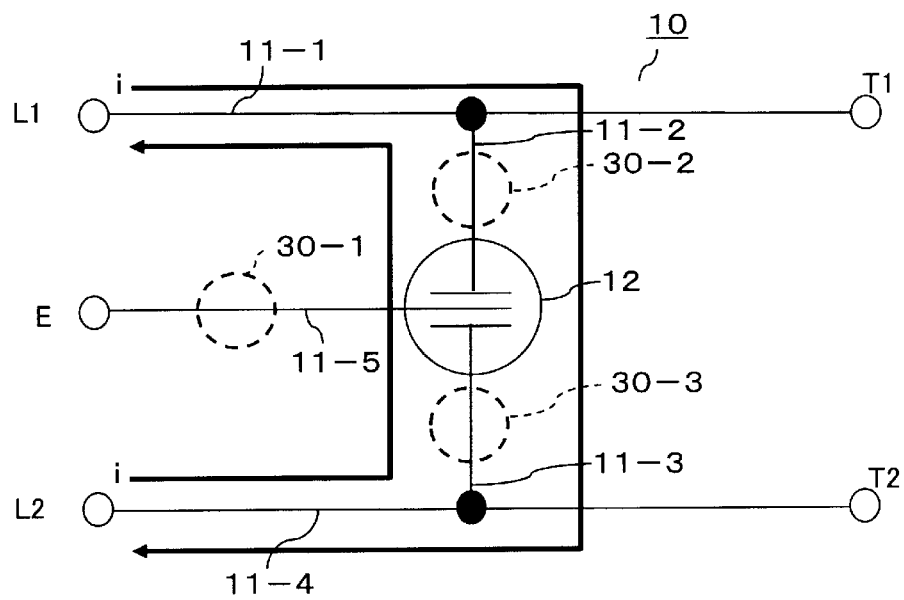
FIG. 8 is a circuit diagram for explaining an operation of the protector of FIG. 1 in a line-to-line mode (i.e., a normal mode)

FIG. 7 is a circuit diagram for explaining an operation of the protector of FIG. 1 in a ground-to-line mode (i.e., a common mode); and FIG. 8 is a circuit diagram for explaining an operation of the protector of FIG. 1 in a line-to-line mode (i.e., a normal mode).

In the ground-to-line mode (i.e., the common mode) of FIG. 7, when surge currents "i" penetrated into the respective line terminals L1 and L2 by a thunderbolt or the like feature a positive polarity, the arrester 12 performs a discharging operation due to an abnormal voltage. Accordingly, the surge current "i" penetrated into the line terminal L1 flows into the earth terminal E through the intermediary of the conductor 11-1, the conductor 11-2 on which the surge current detection device 30-2 is provided, the arrester 12, and the conductor 11-5 on which the surge current detection device 30-1 is provided, as indicated by one of the two solid arrows in FIG. 7. Also, the surge current "i" penetrated into the line terminal L2 flows into the earth terminal E through the intermediary of the conductor 11-4, the conductor 11-3 on which the surge current detection device 30-3 is provided, the arrester 12, and the conductor 11-5 on which the surge current detection device 30-1 is provided, as indicated by the other solid arrow in FIG. 7. Thus, the piece of equipment 25 connected to the equipment terminals T1 and T2 can be protected from the surge currents "i". At this time, the surge current detection devices 30-1, 30-2 and 30-3 are operated.

On the other hand, when surge currents "i" penetrated into the respective line terminals L1 and L2 feature a negative polarity, the arrester 12 performs a discharging operation due to an abnormal voltage. Accordingly, the penetrated surge currents "i" flow into the line terminals L1 and L2 in reverse order, as indicated by the two broken arrows in FIG. 7, respectively. Thus, the piece of equipment 25 connected to the equipment terminals T1 and T2 can be protected from the surge currents "i". At this time, the surge current detection devices 30-1, 30-2 and 30-3 are operated.

In the line-to-line mode (i.e., the normal mode) of FIG. 8, when a surge current "i" featuring a positive polarity is penetrated into the line terminal L1 by a thunderbolt or the like, the arrester 12 performs a discharging operation due to an abnormal voltage. Accordingly, the penetrated surge current "i" flows from the line terminal into the line terminal L2 through the intermediary of the conductor 11-1, the conductor 11-2 on which the surge current detection device 30-2 is provided, the arrester 12, the conductor 11-3 on which the surge current detection device 30-3 is provided, and the conductor 11-4, as indicated by one of the two solid arrows in FIG. 8. Thus, the piece of equipment 25 connected to the equipment terminals T1 and T2 can be protected from the surge currents "i". In this case, since the surge current "i" does not flow into the earth terminal E, only the surge current detection devices 30-2 and 30-3 are operated.

On the other hand, when a surge current "i" featuring a positive polarity is penetrated into the line terminal L2, the arrester 12 performs a discharging operation due to an abnormal voltage. Accordingly, the penetrated surge current "i" flows from the line terminal L2 into the line terminal L1 in reverse order, as indicated by the other solid arrow in FIG. 8. Thus, the piece of equipment 25 connected to the equipment terminals T1 and T2 can be protected from the surge currents "i". In this case, since the surge current "i" does not flow into the earth terminal E, only the surge current detection devices 30-2 and 30-3 are operated.

(Operation of Surge Current Detection Device of the First Embodiment)

Figure 9:
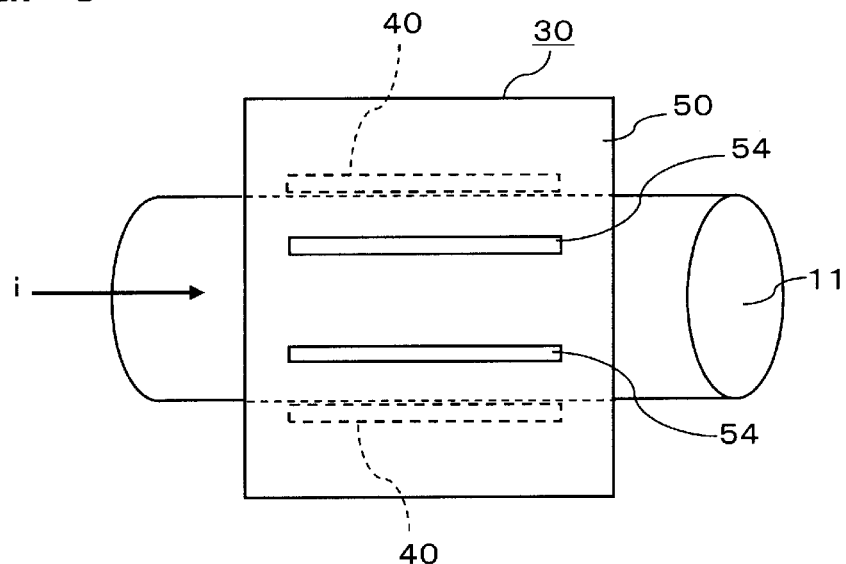
FIG. 9 is a schematic plan view of the surge current detection device shown in FIGS. 2 and 3, seeing from the side of the front surface of the ferromagnetic material sheet, to explain an operation of the surge current detection device.
Figure 10:
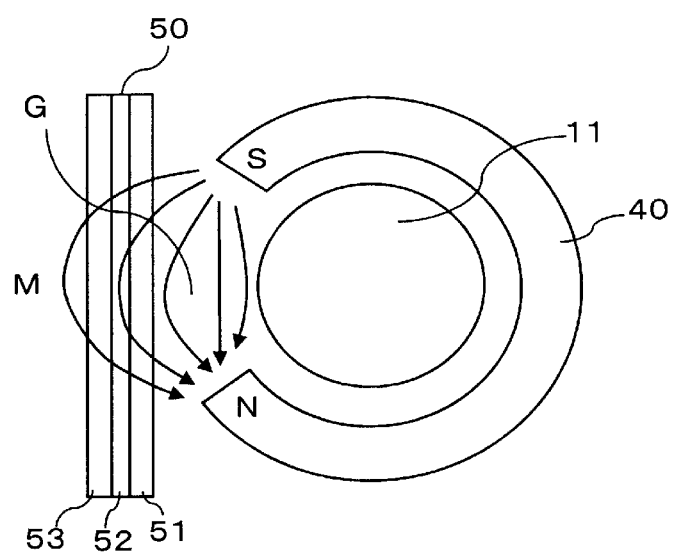
FIG. 10 is a right side view of FIG. 9.

FIG. 9 is a schematic plan view of the surge current detection device 30 shown in FIGS. 2 and 3, seeing from the side of the front surface of the ferromagnetic material sheet, to explain an operation of the surge current detection device; and FIG. 10 is a right side view of FIG. 9.

As shown in FIG. 9, in the surge current detection device 30 mounted on the conductor 11, when the surge current "i" flows into the conductor 11 in the rightward direction, as indicated by the arrow in FIG. 9, a magnetic field is generated around the conductor 11, and, as shown in FIG. 10, a magnetic flux M defining the magnetic field is uniformly produced counterclockwise. By the generally-cylindrical magnetic flux concentration member 40 having the gap G, the magnetic flux M uniformly produced around the conductor 11 is concentrated at a high density in the gap G defining the detection area.

In the recording layer 52 of the ferromagnetic material sheet 50 disposed over the gap G by the holder 60, the microcapsules 52a positioned just above the gap G are subjected to the horizontal magnetic flux M. Thus, the magnetic particles 52a1 contained in the microcapsules 52a concerned are horizontally oriented so that the surface color of the horizontally-oriented magnetic particles 52a1 is observed through the transparent protective film 53. On the other hand, the magnetic flux M slantly passes through each of two linear regions of the recording layer 52 which extend along both sides of the gap G, so that the microcapsules 52a included in each of the two linear regions is subjected to the slant magnetic flux M. Thus, the magnetic particles 52a1 contained in the microcapsules 52a included in each linear region are slantly oriented so that the linear region concerned is observed as a linear dark region through the transparent protective film 53 due to the slantly-oriented magnetic particles 52a1. In short, as shown in FIG. 9, the two linear dark regions appear as surge current detection results 54 on the transparent protective film 53 along both the sides of the gap G (i.e., the linear slit 42), and thus it is possible to clearly observe a variation of the orientation state of the magnetic particles 52a1.

Accordingly, by the two linear regions forming the surge current detection results 54, it is possible to visually recognize a penetration of a surge current into the conductor 11, and it is also possible to detect a magnitude of the surge current and a frequency of the surge current penetrations by a thickness of the two linear regions.

FIGS. 11 to 14 are views showing a variety of surge current detection results obtained by tests which was carried out by using the surge current detection device 30 shown in FIGS. 2 and 3.

Figure 11:
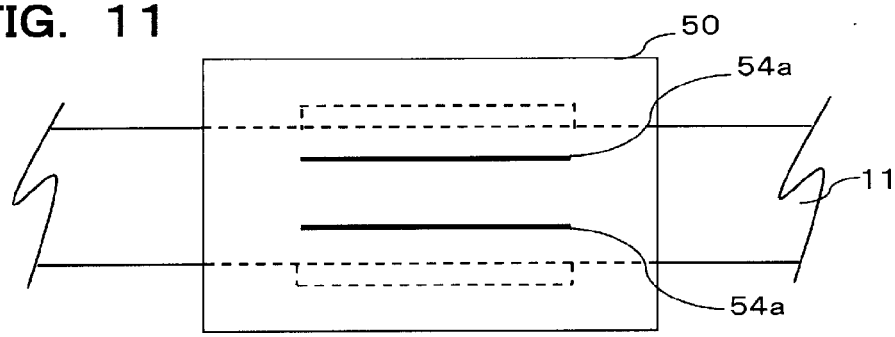
FIG. 11 is a view showing surge current detection results which are obtained by a test which was carried out by using the surge current detection device of FIGS. 2 and 3 when the surge current "i" was 500 A, and when the application of the surge current was one time.
Figure 12:
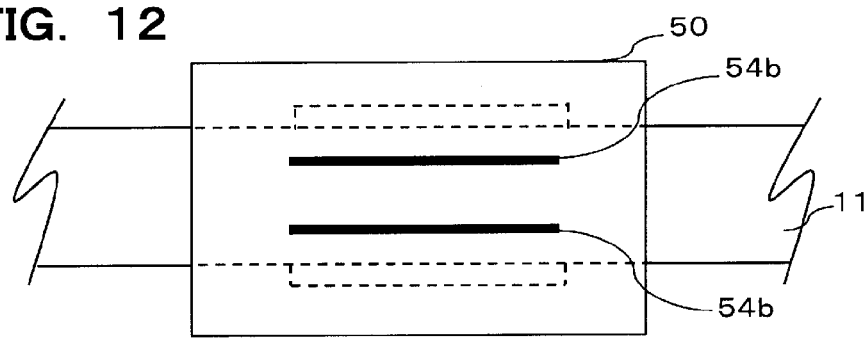
FIG. 12 is a view showing surge current detection results which are obtained by a test which was carried out by using the surge current detection device of FIGS. 2 and 3 when the surge current "i" was 1 kA, and when the application of the surge current was one time.
Figure 13:
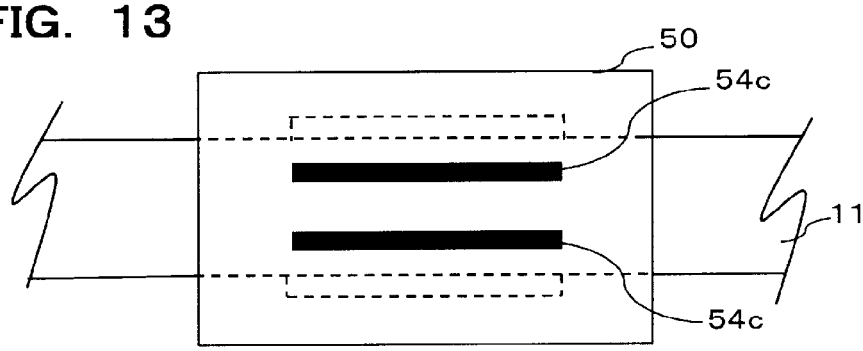
FIG. 13 is a view showing surge current detection results which are obtained by a test which was carried out by using the surge current detection device of FIGS. 2 and 3 when the surge current "i" was 2 kA, and when the application of the surge current was one time.
Figure 14:
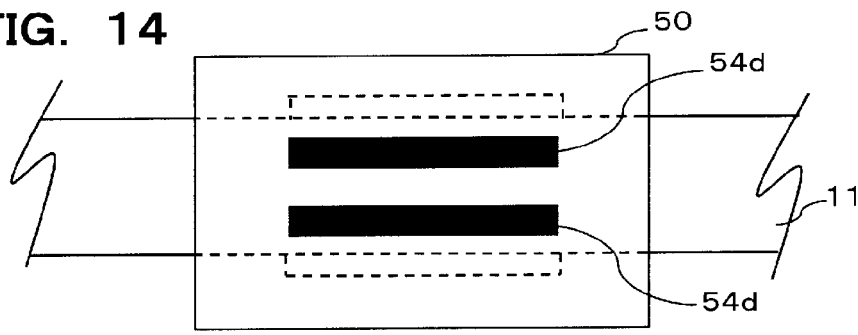
FIG. 14 is a view showing surge current detection results which are obtained by a test which was carried out by using the surge current detection device of FIGS. 2 and 3 when the surge current "i" was 2 kA, and when the application of the surge current was three times.

Herein, FIG. 11 is a view showing surge current detection results 54a which are obtained by a test which was carried out by using the surge current detection device of FIGS. 2 and 3 when the surge current "i" was 500 A, and when the application of the surge current was one time. Similarly, FIG. 12 is a view showing surge current detection results 54b which are obtained by a test which was carried out by using the surge current detection device of FIGS. 2 and 3 when the surge current "i" was 1 kA, and when the application of the surge current was one time; FIG. 13 is a view showing surge current detection results 54c which are obtained by a test which was carried out by using the surge current detection device of FIGS. 2 and 3 when the surge current "i" was 2 kA, and when the application of the surge current was one time; and FIG. 14 is a view showing surge current detection results 54d which are obtained by a test which was carried out by using the surge current detection device of FIGS. 2 and 3 when the surge current "i" was 2 kA, and when the application of the surge current was three times.

As is apparent from FIGS. 11 to 14, the lager the magnitude of the surge current and the frequency of the penetrations of the surge currents, the thicker the thickness of the linear regions forming the surge current detection results 54a, 54b, 54c and 54d. Thus, it is possible to detect the magnitude of the surge currents and the frequency of the penetrations of the surge currents from the thickness of the linear regions.

Advantages of the First Embodiment

In the first embodiment, the following advantages (1), (2) and (3) can be obtained:

(1) With the arrangement of the surge current detection device 30 in which the magnetic flux M defining the magnetic field Hh or Hv generated by the surge current "i" penetrating into the conductor 11 is concentrated in the detection area (i.e., the gap G) at a high density, so that an orientation state of the magnetic particles 52a1 contained in the microcapsules 52a of the ferromagnetic material sheet 50 is varied, it is possible to visually and clearly recognize the variation of the orientation state of the magnetic particles 52a1 even if a time of the penetration of the surge current "i" is small, and thus it is possible to simply and surely detect the magnitude of the surge current and the frequency of the surge current penetrations.

(2) Due to the advantages stated in Item (1), the surge current detection device 30 can be safely constituted without utilizing dangerous Joule heat generation. In addition, since the ferromagnetic material sheet 50 can be made close to the conductor 11 by using the holder 60, the surge current detection device 30 can have a simple structure, and can be easily downsized and compactly installed.

(3) Since the orientation state of the magnetic particles 52a1 can be easily reset by using a magnet, it is possible to repeatedly reuse the surge current detection device 30, resulting in a decrease in production cost of the surge current detection device 30.

Second Embodiment

Arrangement of the Second Embodiment

Figure 15:
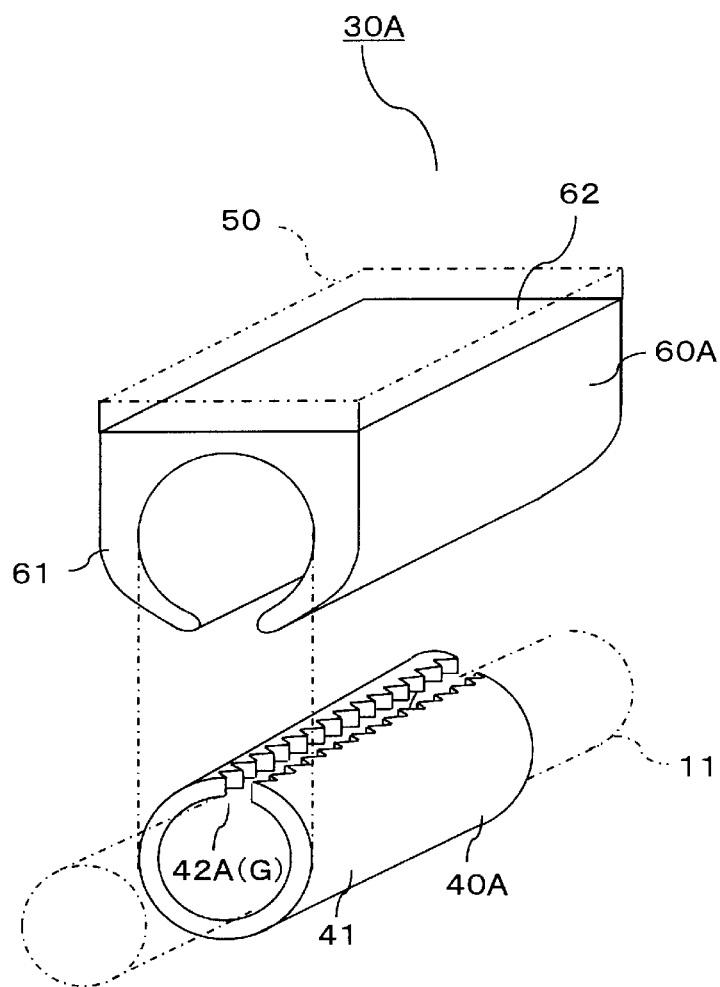
FIG. 15 is an exploded perspective view of a surge current detection device according to the second embodiment of the present invention.

FIG. 15 is an exploded perspective view of a surge current detection device according to the second embodiment of the present invention. In this drawing, the same references as in FIGS. 2 and 3 showing the first embodiment indicate the same or corresponding elements.

The surge current detection device 30A according to the second embodiment of the present invention includes a magnetic flux concentration member 40A and a holder 60A which are different in construction from the magnetic flux concentration member 40 and the holder 60 of the first embodiment, and a ferromagnetic material sheet 50 which is similar to that of the first embodiment.

Similar to the first embodiment, the magnetic flux concentration member 40A includes a cylindrical holder portion 41 for holding a conductor 11 having the circular cross-sectional shape. The cylindrical holder portion 41 is made of a monolithic ferromagnetic material, and has a slit 42A axially formed therein, which is different in shape from the linear slit 42 of the first embodiment. As shown in FIG. 15, the slit 42A is defined by two opposite serrated side faces. Namely, each of the side faces defining the slit 42A is formed with a plurality of triangular recesses and a plurality of triangular protrusions which are alternately arranged. Similar to the first embodiment, the slit 42A serves as a gap G which define a detection area in which a magnetic flux M generated by a surge current penetrated into the conductor 11 is concentrated at a high density.

Similar to the first embodiment, the holder 60A is provided to set and fix the ferromagnetic material sheet 50 at a position at which the ferromagnetic material sheet 50 is opposed to the gap G of the magnetic flux concentration member 40A, and includes: a holder portion 61 having a cylindrical groove formed therein, which receives and holds the magnetic flux concentration member 40A; and an attachment portion 62 defining a bottom of the cylindrical groove of the holder portion 61 and having a flat surface to which a rear surface of the ferromagnetic material sheet 50 is adhered and fixed with a suitable adhesion agent or the like. However, an elongated opening, as indicated by reference 63 in the first embodiment, is not formed in the attachment portion 62. In the second embodiment, both the holder portion 61 and the attachment portion 62 are integrally formed of a suitable material, having a small magnetic permeability, such as a plastic and so on. Preferably, the thickness of the attachment portion 62 becomes as small as possible so that the magnetic flux M generated in the gap G of the magnetic flux concentration member 40A is efficiently applied to the ferromagnetic material sheet 50.

In the second embodiment, other features of the surge current detection device 30A and a whole arrangement of the protector 10 are similar to those of the first embodiment.

Operation of the Second Embodiment

In the surge current detection device 30A mounted on the conductor 11, when a surge current "i" flows into the conductor 11, a magnetic field is generated around the conductor 11, and a magnetic flux M defining the magnetic field is uniformly produced around the conductor 11. By the magnetic flux concentration member 40A having the gap G, the magnetic flux M produced around the conductor 11 is concentrated in the gap G defining the detection area at a high density.

Thus, in the recording layer 52 of the ferromagnetic material sheet 50 disposed over the gap G by the holder 60A, the magnetic flux M is applied to the microcapsules 52a, positioned above the gap G, through the attachment portion 62 of the holder 60A, to thereby vary an orientation state of the magnetic particles 52a1 contained in the microcapsules 52a concerned, in substantially the same manner as the case of the first embodiment. Accordingly, similar to the first embodiment, two serrated dark regions appear as surge current detection results 54 on the transparent protective film 53 along both the sides of the gap G (i.e., the slit 42A), and thus it is possible to clearly observe a variation of the orientation state of the magnetic particles 52a1.

Thus, it is visually recognized that the surge current "i" has been penetrated into the conductor 11 by the two serrated dark regions indicating the surge current detection results 54. Further, it is possible to detect a magnitude of the surge currents and a frequency of penetrations of the surge currents from a thickness of the two serrated dark regions.

Advantages of the Second Embodiment

Similar to the first embodiment, according to the second embodiment of the present invention, with the arrangement of the surge current detection device 30A in which the magnetic flux M produced by the surge current "i" penetrating into the conductor 11 is concentrated in the detection area (i.e., the gap G) at a high density, so that an orientation state of the magnetic particles 52a1 contained in the microcapsules 52a of the ferromagnetic material sheet 50 is varied through the attachment portion 62 of the holder 60A. Accordingly, it is possible to visually and clearly recognize the variation of the orientation state of the magnetic particles 52a1 even if a time of the penetration of the surge current "i" is small, and it is also possible to simply and surely detect the magnitude of the surge current and the frequency of the surge current penetrations.

Especially, in the second embodiment, an elongated opening, as indicated by reference 63 in the first embodiment, is not formed in the attachment portion 62 of the holder 60A, and thus it is possible to simply construct the holder 60A.

Further, since each of the side faces defining the slit 42A is formed with the plurality of triangular recesses and the plurality of triangular protrusions which are alternately arranged, a virtual length of the slit 42A becomes longer so that the magnetic flux passing through the slit 42A is increased, and thus it is possible to efficiently vary the orientation state of the magnetic particles 52*a*1. Accordingly, it is possible to obtain the advantage similar to the first embodiment, even if the elongated opening, as indicated by reference 63 in the first embodiment, is not formed in the attachment portion 62 of the holder 60A. Also, in the second embodiment, it is possible to obtain the aforesaid advantages, as stated in Items (2) and (3) in the first embodiment.

Modification of the Second Embodiment

In the second embodiment, the slit 42A may be formed as a linear slit or it may have another shape. Also, an opening, as indicated by reference 63 in the first embodiment, may be formed in the attachment portion 62 and the holder 60A.

Third Embodiment

Arrangement of the Third Embodiment

Figure 16:
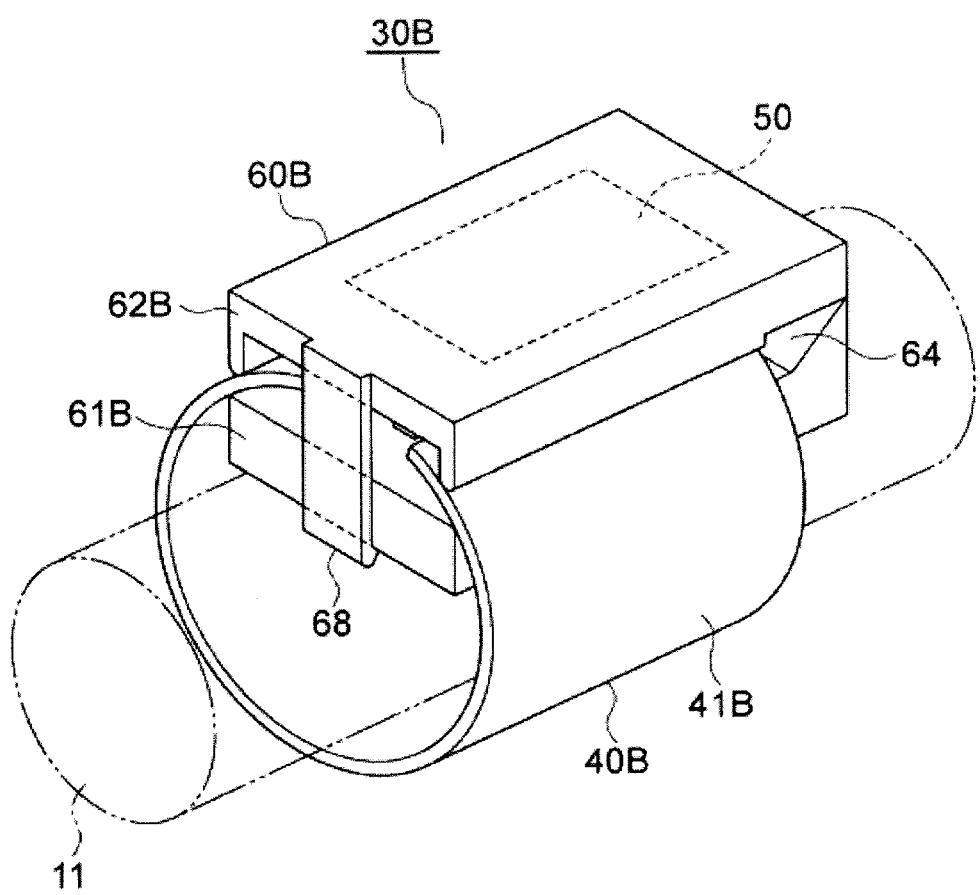
FIG. 16 is a perspective view showing a surge current detection device according to the third embodiment of the present invention.
Figure 17:
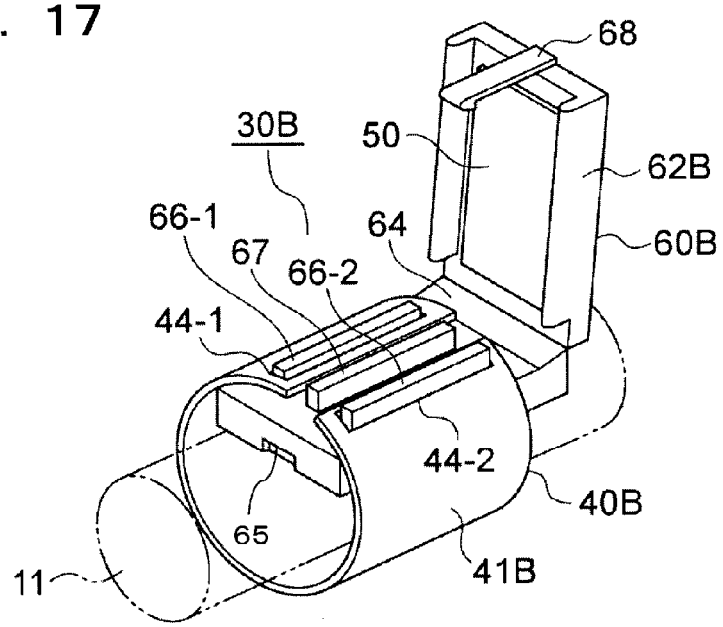
FIG. 17 is a perspective view showing the surge current detection device of FIG. 16 in an open-state.
Figure 18:
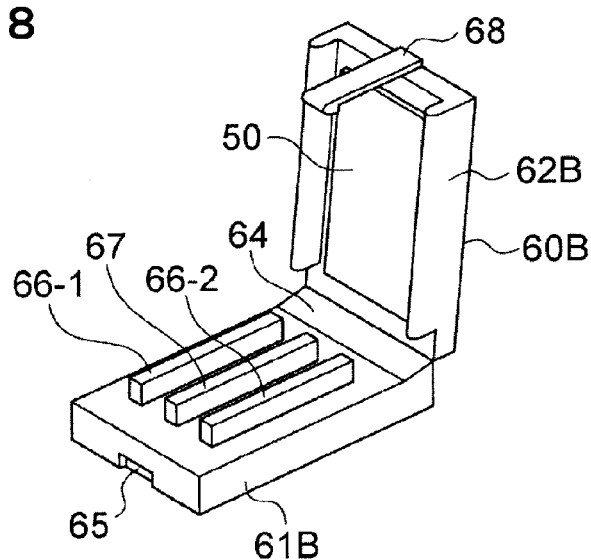
FIG. 18 is a perspective view showing a holder of the surge current detection device of FIG. 17.
Figure 19:
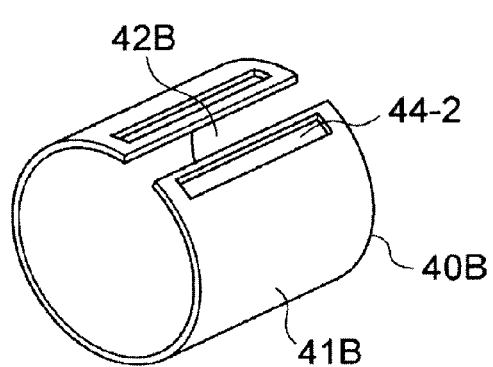
FIG. 19 is a perspective view of a magnetic flux concentration member of the surge current detection device of FIG. 17.

FIG. 16 is a perspective view showing a surge current detection device 30B according to the third embodiment of the present invention. Also, FIG. 17 is a perspective view showing the surge current detection device 30B of FIG. 16 in an open-state; FIG. 18 is a perspective view showing a holder 60B of the surge current detection device 30B of FIG. 17; and FIG. 19 is a perspective view of a magnetic flux concentration member 40B of the surge current detection device 30B of FIG. 17. In these drawings, the same references as in FIGS. 2 and 3 indicate the same or corresponding elements.

The surge current detection device 30B according to the third embodiment of the present invention includes a magnetic flux concentration member 40B and a holder 60B which are different in construction from the magnetic flux concentration member 40 and the holder 60 of the first embodiment, and a ferromagnetic material sheet 50 which is similar to that of the first embodiment.

In this third embodiment, the magnetic flux concentration member 40B includes a cylindrical holder portion 41B for holding a conductor 11 having the circular cross-sectional shape. The cylindrical holder portion 41B is made of a monolithic ferromagnetic material, and has a linear slit 42B axially extending through the cylindrical holder portion 41B. Similar to the first embodiment, the linear slit 42B serves as a gap G defining a detection area in which a magnetic flux M generated by a surge current penetrated into the conductor 11 is concentrated at a high density. Also, a pair of elongated rectangular attachment holes 44-1 and 44-2 are formed to extend axially in the cylindrical holder portion 41B on both the sides of the linear slit 42B, as shown in FIGS. 17 and 19.

Also, in the third embodiment, the holder 60B is to position and set the ferromagnetic material sheet 50 over the gap G of the magnetic flux concentration member 40B, and includes a plate-like holder portion 61B, and an attachment portion 62B which is joined to the plate-like holder portion 61B by a hinge portion 64 so that the attachment portion 62B is movable between a closed position (FIG. 16) and an opened position (FIGS. 17 and 18). As shown in FIGS. 17 and 18, the ferromagnetic material sheet 50 is adhered and attached to a rear surface of the attachment portion 62B, and the plate-like holder portion 61B is covered with the ferromagnetic material sheet 50 when the attachment portion 62B is at the closed position (FIG. 16), so that the ferromagnetic material sheet 50 is disposed over the gap G (i.e., the detection area). The plate-like holder portion 61B, the attachment portion 62B and the hinge portion 64 may be integrally formed of a suitable material, having a small magnetic permeability, such as a plastic or the like. Both the plate-like holder portion 61B and the attachment portion 62B are detachably engaged with the magnetic flux concentration member 40B to hold the member 40B, as stated hereinbelow.

As shown in FIGS. 17 and 18, a notch 65 is formed in the end face of the plate-like holder portion 61B opposite to the hinge portion 64, and is used to detachably engage the plate-like holder portion 61B and the attachment portion 62B with each other. Also, as best shown in FIG. 18, a pair of ridge-like protrusions 66-1 and 66-2 are provided on the upper surface of the plate-like holder portion 61B which is covered with the ferromagnetic material sheet 50 when the attachment portion 62B is at the closed position (FIG. 16). A distance between the ridge-like protrusions 66-1 and 66-2 is substantially equivalent to a distance between the elongated rectangular attachment holes 44-1 and 44-2 which are somewhat larger in size than the ridge-like protrusions 66-1 and 66-2, so that the ridge-like protrusions 66-1 and 66-2 are fittingly received in the respective elongated rectangular attachment holes 44-1 and 44-2 when the plate-like holder portion 61B is inserted into the cylindrical holder portion 41B. Further, a ridge-like protrusion 67 is provided on the upper surface of the plate-like holder portion 61B between the ridge-like protrusions 66-1 and 66-2, to divide the space of the linear slit 42B into two sections by the ridge-like protrusion 67 when the ridge-like protrusions 66-1 and 66-2 are received in the respective elongated rectangular attachment holes 44-1 and 44-2, as shown in FIG. 17.

As shown in FIGS. 17 and 18, a finger member 68 is attached to the end face of the attachment portion 62B opposite to the hinge portion 64, and terminates with a pawl-like element. When the attachment portion 62B is moved from the opened position (FIGS. 17 and 18) to the closed position (FIG. 16), the pawl-like element of the finger member 68 is snugly engaged with the notch 65 of the plate-like holder portion 61B. In short, the plate-like holder portion 61B and the attachment portion 62B are detachably engage with each other. The rear surface of the attachment portion 62B is flat, and the ferromagnetic material sheet 50 is adhered and fixed to the flat rear surface with the adhesion agent or the like. Thus, in this third embodiment, at least the attachment portion 62B should be made of a transparent material so that the ferromagnetic material sheet 50 can be observed through the attachment portion 62B.

The hinge portion 64, by which the plate-like holder portion 61B and the attachment portion 62B are movably connected to each other, may be made of a flexible plastic thin sheet or may be formed as a mechanical hinge.

In the third embodiment, for example, a mount of the surge current detection device 30B on a conductor 11 may be carried out: by introducing the conductor 11 into the magnetic flux concentration member 40B; by inserting the plate-like holder portion 61B of the opened holder 60 into the magnetic flux concentration member 40B such that the ridge-like protrusions 66-1 and 66-2 of the plate-like holder portion 61B are fittingly received in the respective elongated rectangular attachment holes 44-1 and 44-2 of the magnetic flux concentration member 40B; and by moving the attachment portion 62B having the ferromagnetic material sheet 50 to the plate-like holder portion 61B until the pawl-like element of the finger member 68 is snugly engaged with the notch 65 of the plate-like holder portion 61B.

In the third embodiment, other features of the surge current detection device 30B and a whole arrangement of the protector 10 are similar to those of the first embodiment.

Operation of the Third Embodiment

In the surge current detection device 30B mounted on the conductor 11 of FIG. 1 6, similar to the first embodiment, when a surge current "i" flows into the conductor 11, a magnetic field is generated around the conductor 11, and a magnetic flux M defining the magnetic field is uniformly produced around the conductor 11. Thus, by the cylindrical magnetic flux concentration member 40B having the gap G, the magnetic flux M uniformly produced around the conductor 11 is concentrated in the gap G defining the detection area at a high density.

Thus, similar to the first embodiment, in the recording layer 52 of the ferromagnetic material sheet 50 disposed over the gap G by the holder 60B, the magnetic flux M is directly applied to the microcapsules 52a positioned above the gap G, to thereby vary an orientation state of the magnetic particles 52a1 contained in the microcapsules 52a concerned. Accordingly, similar to the first embodiment, two linear dark regions appear as surge current detection results 54 on the transparent protective film 53 along both the sides of the gap G (i.e., the linear slit 42B), and thus it is possible to clearly observe a variation of the orientation state of the magnetic particles 52a1.

Thus, due to the two dark regions forming the surge current detection results 54, it is visually recognized that the surge current "i" has been penetrated into the conductor 11. Further, it is possible to detect a magnitude of the surge currents and a frequency of penetrations of the surge currents from a thickness of the two dark regions.

Advantages of the Third Embodiment

Similar to the first embodiment, according to the third embodiment of the present invention, with the arrangement of the surge current detection device 30B in which the magnetic flux M produced by the surge current "i" penetrating into the conductor 11 is concentrated in the detection area (i.e., the gap G) at a high density, so that an orientation state of the magnetic particles 52a1 contained in the microcapsules 52a of the ferromagnetic material sheet 50 is directly varied, it is possible to visually and clearly recognize the variation of the orientation state of the magnetic particles 52a1 even if a time of the penetration of the surge current "i" is small, and thus it is possible to simply and surely detect the magnitude of the surge current and the frequency of the surge current penetrations.

Especially, since the holder 60B according to the third embodiment of the present invention is constituted such that the attachment portion 62B is moved between the opened position and the closed position with respect to the plate-like holder portion 61B in order to hold the magnetic flux concentration member 40B, a size of the magnetic flux concentration member 40B is not limited. Namely, it is possible to use the holder 60B to hold magnetic flux concentration members 40B having different sizes. Thus, the surge current detection device 30B can be mounted on a conductor 11 or cable having a variety of diameters. Also, in the third embodiment, it is possible to obtain the aforesaid advantages, as stated in Items (2) and (3) in the first embodiment.

Modifications of the Third Embodiment

The surge current detection device 30B according to the third embodiment of the present invention may be modified as stated in the following Items (a), (b) and (c):

(a) The ridge-like protrusion 67, by which the space of the linear slit 42B is divided into the two sections, may be omitted, if necessary. In this case, it is possible to simply form and configure the holder 60B.

(b) When the ferromagnetic material sheet 50 features a superior surge current detection ability, the ferromagnetic material sheet 50 may be attached to the attachment portion 62B by adhering the rear surface of the ferromagnetic material sheet 50 to the front surface of the attachment portion 62B with an adhesion agent or the like. In this case, the attachment portion 62B may not be made of the transparent material.

(c) A window-like opening may be formed in the attachment portion 62B to set the ferromagnetic material sheet 50 therein. In this case, since the magnetic flux M can be directly applied from the magnetic flux concentration member 40B to the ferromagnetic material sheet 50 through the window-like opening, it is possible to improve a detection sensitivity of a surge current in the ferromagnetic material sheet 50.

Fourth Embodiment

Arrangement of the Fourth Embodiment

Figure 20:
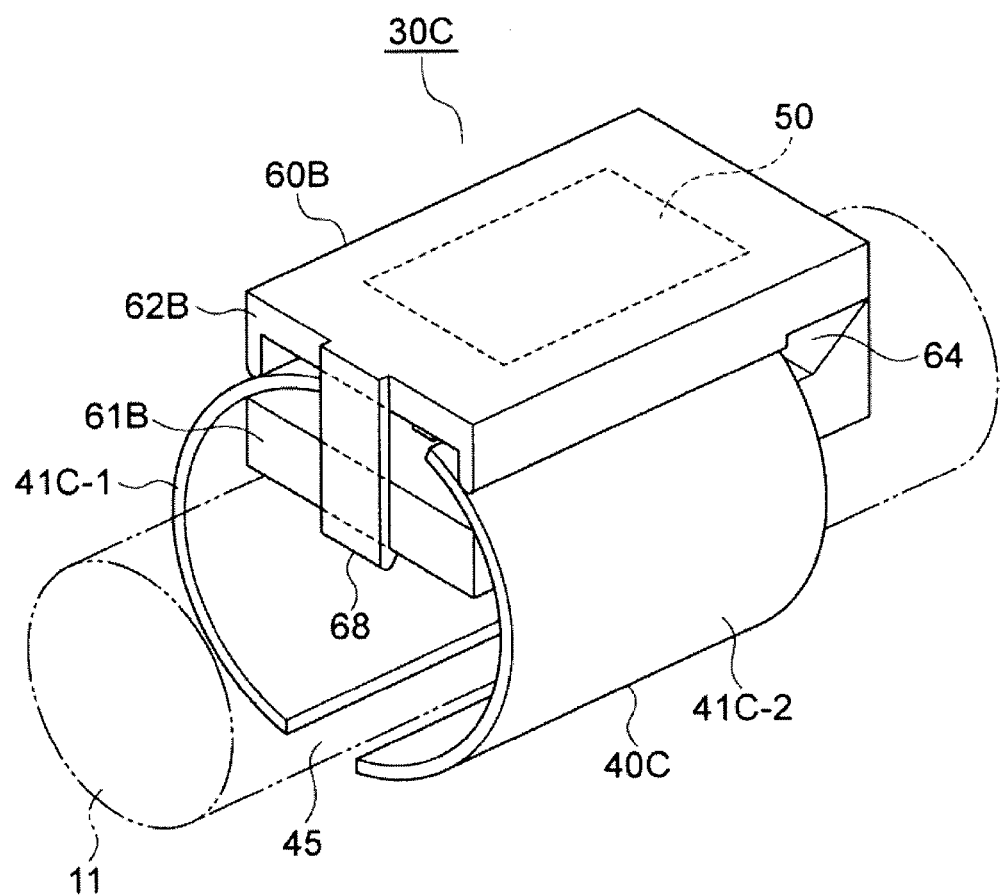
FIG. 20 is a perspective view showing a surge current detection device according to the third embodiment of the present invention.
Figure 21:
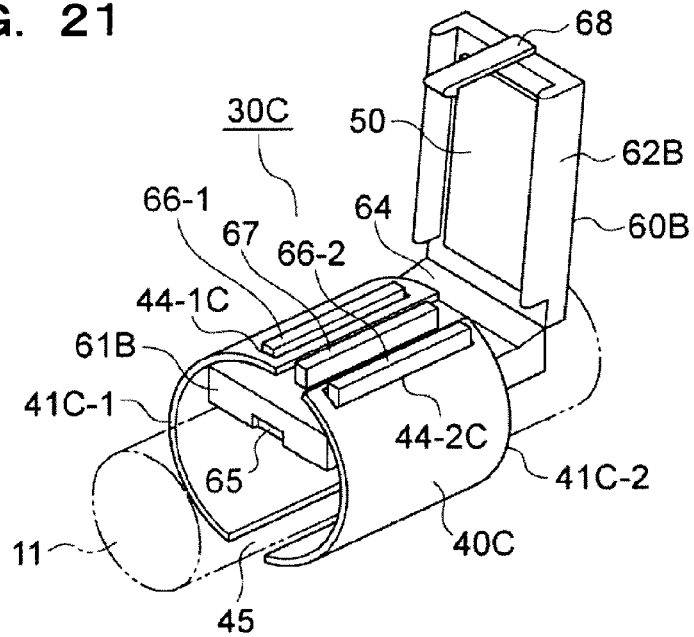
FIG. 21 is a perspective view showing the surge current detection device of FIG. 20 in an open-state.
Figure 22:
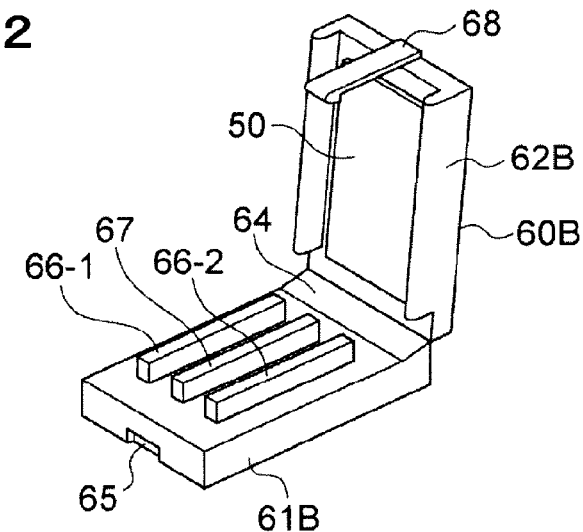
FIG. 22 is a perspective view showing a holder of the surge current detection device of FIG. 21.
Figure 23:
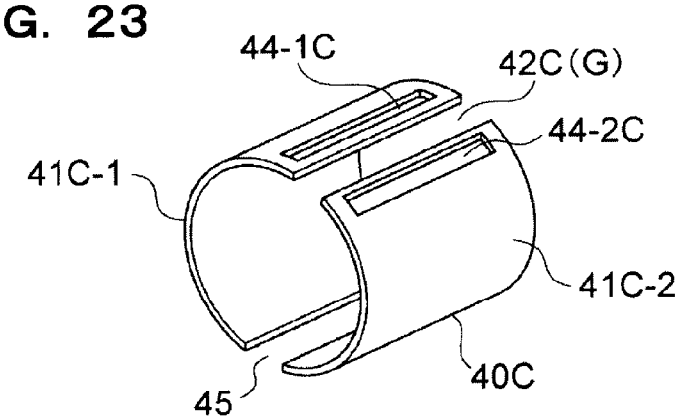
FIG. 23 is a perspective view of a magnetic flux concentration member of the surge current detection device of FIG. 21.

FIG. 20 is a perspective view showing a surge current detection device 30C according to the third embodiment of the present invention. Also, FIG. 21 is a perspective view showing the surge current detection device 30B of FIG. 20 in an open-state; FIG. 22 is a perspective view showing a holder 60B of the surge current detection device 30C of FIG. 21; and FIG. 23 is a perspective view of a magnetic flux concentration member 40C of the surge current detection device 30C of FIG. 21. In these drawings, the same references as in FIGS. 16 to 19 showing the third embodiment indicate the same or corresponding elements.

The surge current detection device 30C according to the fourth embodiment of the present invention includes a magnetic flux concentration member 40C which is different in construction from the magnetic flux concentration member 40 of the third embodiment, and a ferromagnetic material sheet 50 and a holder 60B which are similar to those of the third embodiment.

In this fourth embodiment, the magnetic flux concentration member 40C includes a pair of semi-cylindrical holder portions 41C-1 and 41C-2 for holding a conductor 11 having the circular cross-sectional shape, and the semi-cylindrical holder portions 41C-1 and 41C-2 are independent from each other, and are made of a suitable ferromagnetic material. Also, elongated rectangular attachment holes 44C-1 and 44C-2 are formed at the respective upper ends of the semi-cylindrical holder portions 41C-1 and 41C-2, as shown in FIGS. 21 and 23.

Similar to the third embodiment, the holder 60B is a plate-like holder portion 61B, and an attachment portion 62B which is connected to the plate-like holder portion 61B through a hinge portion 64 so that the attachment portion 62B is movable between a closed position (FIG. 20) and an opened position (FIGS. 21 and 22), and the ferromagnetic material sheet 50 is adhered and attached to a rear surface of the attachment portion 62B, and the plate-like holder portion 61B is covered with the ferromagnetic material sheet 50 when the attachment portion 62B is at the closed position (FIG. 20). As shown in FIGS. 21 and 23, when ridge-like protrusions 66-1 and 66-2 of the plate-like holder portion 61B are received in the respective elongated rectangular attachment holes 44C-1 and 44C-2, the semi-cylindrical holder portions 41C-1 and 41C-2 are positioned so as to opposed to each other, so that a linear slit 42C having a gap G is defined between the upper ends of both the semi-cylindrical holder portions 41C-1 and 41C-2, and so that a groove-like opening 45 is defined between the lower ends of both the semi-cylindrical holder portions 41C-1 and 41C-2. Similar to the third embodiment, the gap G of the linear slit 42C serves as a detection area in which a magnetic flux M produced by a surge current penetrated into the conductor 11 is concentrated at a high density. Also, an introduction of the conductor 11 into the magnetic flux concentration member 40C and a removal of the conductor 11 from the magnetic flux concentration member 40C are carried out through the groove-like opening 45 defined between the lower ends of both the semi-cylindrical holder portions 41C-1 and 41C-2.

In the fourth embodiment, for example, a mount of the surge current detection device 30C on a conductor 11 may be carried out: by opening the holder 60B so that the attachment portion 62B having the ferromagnetic material sheet 50 adhered to either a rear surface thereof or a front surface thereof is moved from a closed position (FIG. 20) to an opened position (FIGS. 21 and 22); by setting the semi-cylindrical holder portions 41C-1 and 41C-2 on the plate-like holder portion 61B so that the ridge-like protrusions 66-1 and 66-2 of the plate-like holder portion 61B are received in the respective elongated rectangular attachment holes 44C-1 and 44C-2; by closing the holder 60B so that the attachment portion 62B is moved from the opened position (FIGS. 21 and 22) to the closed position (FIG. 20) so as to snugly engage a pawl-like element of a finger member 68 of the attachment portion 62B with a notch 65 of the plate-like holder portion 61B, resulting in the magnetic flux concentration member 40C being held by the holder 30C; and by introducing the conductor 11 into the magnetic flux concentration member 40C through the groove-like opening 45.

In the fourth embodiment, other features of the surge current detection device 30C and a whole arrangement of the protector 10 are similar to those of the third embodiment.

Operation of the Fourth Embodiment

In the surge current detection device 30C mounted on the conductor 11 of FIG. 21, similar to the third embodiment, when a surge current "i" flows through the conductor 11, a magnetic flux M is generated around the conductor 11, and a magnetic flux M defining the magnetic field H is uniformly produced around the conductor 11. Thus, by the magnetic flux concentration member 40C having the gap G, the magnetic flux M, which is uniformly produced around the conductor 11, is concentrated in the gap G defining the detection area at a high density. Accordingly, two linear dark regions appear as surge current detection results 54 on a transparent protective film 53 of the ferromagnetic material sheet 50 along both the sides of the gap G (i.e., the linear slit 42C), and thus it is possible to clearly observe a variation of the orientation state of the magnetic particles 52a1.

Similar to the third embodiment, according to the fourth embodiment of the present invention, it is possible to visually and clearly recognize the variation of the orientation state of the magnetic particles 52a1 even if a time of the penetration of the surge current "i" is short, and thus it is possible to simply and surely detect the magnitude of the surge current and the frequency of the surge current penetrations.

Advantages of the Fourth Embodiment

Especially, in the surge current detection device 30C according to the fourth embodiment of the present invention, since the magnetic flux concentration member 40C features the groove-like opening 45 defined by the lower ends of the semi-cylindrical holder portions 41C-1 and 41C-2, it is possible to detachably mount the surge current detection device 30C on the conductor 11 without opening and closing the holder 30B. Further, by investing the semi-cylindrical holder portions 41C-1 and 41C-2 with elasticity, it is possible to mount the surge current detection device 30C on a conductor 11 or cable having a variety of diameters. Also, in the fourth embodiment, it is possible to obtain the advantages similar to those of the third embodiment.

Modifications of the Fourth Embodiment

The surge current detection device 30C according to the fourth embodiment of the present invention may be modified as stated in the aforesaid Items (a), (b) and (c) in the third embodiment.

Fifth Embodiment

Arrangement of the Fifth Embodiment

Figure 24:
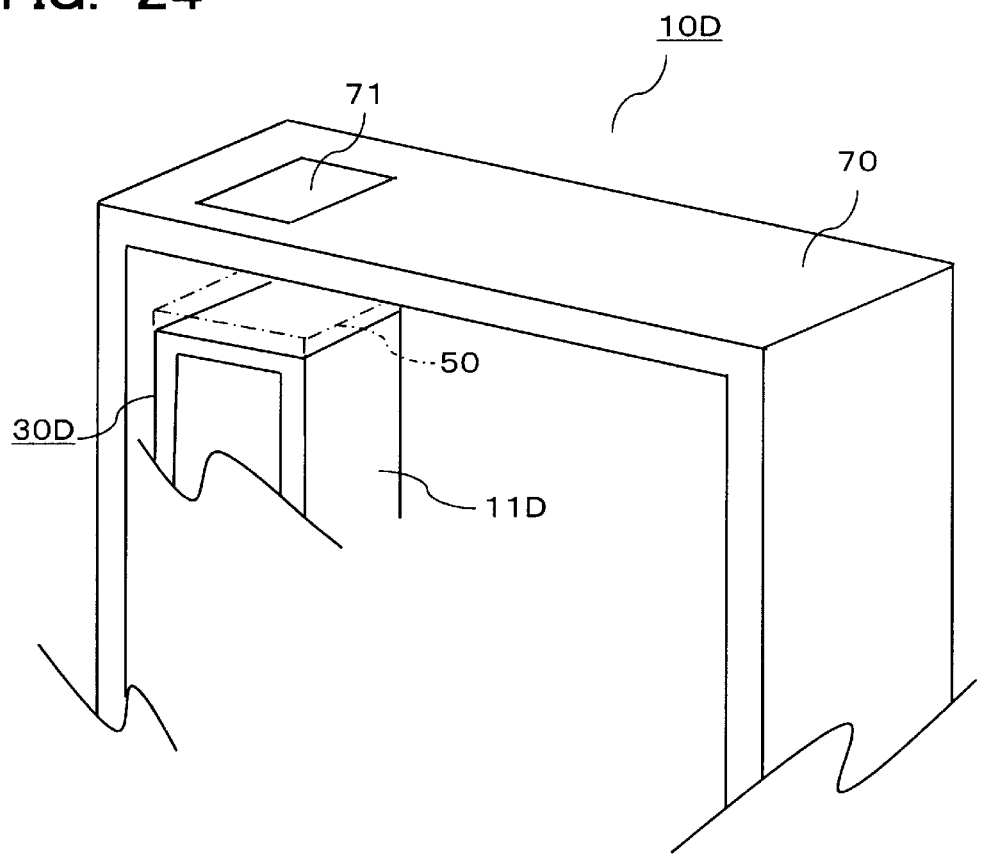
FIG. 24 is a perspective schematic view showing a part of a protector in which a surge current detection device according to a fifth embodiment of the present invention is installed.
Figure 25:
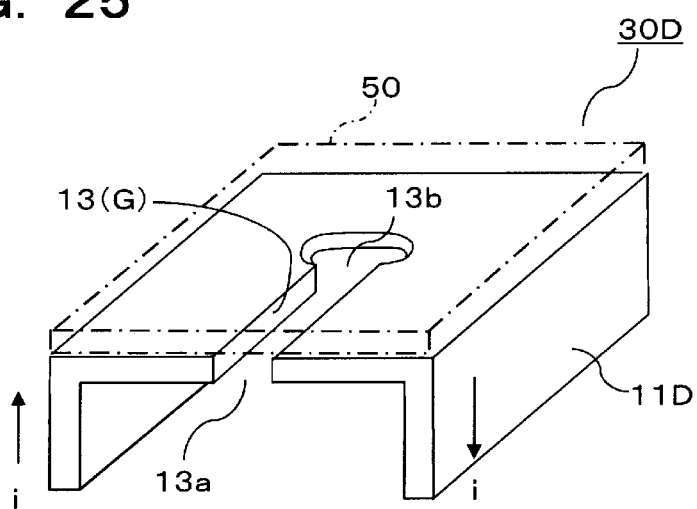
FIG. 25 is a perspective view showing the surge current detection device shown in FIG. 24.

FIG. 24 is a perspective schematic view showing a part of a protector in which a surge current detection device according to a fifth embodiment of the present invention is installed; and FIG. 25 is a perspective view showing the surge current detection device shown in FIG. 24. In these drawings, the same references as in FIGS. 1, 2 and 3 showing the first embodiment indicate the same or corresponding elements. Note, in FIG. 24, the slit 13 is omitted to avoid complexity of illustration.

Similar to the protector 10 in the first embodiment, a protector 10D according to the fifth embodiment of the present invention is to protect a piece of equipment 25 to be protected (FIG. 1), such as a piece of communication equipment and so on, from a surge current caused by a thunderbolt and so on. The protector 10D includes a housing 70 which houses line terminals L1 and L2, an earth terminal E, equipment terminals T1 and T1 and an arrester 12, which are similar to those of the first embodiment of FIG. 1. The housing 70 further houses a plurality of circuit-connection conductors 11D (only one of which is illustrated in FIG. 24) which are different in configuration from the plurality of conductors 11 as shown in FIG. 1, and surge current detection devices 30D (only one of which is illustrated in FIG. 24) which are different in construction from the surge current detection devices 30 as shown in FIGS. 2 and 3.

In this fifth embodiment, for example, three of the circuit-connection conductors 11D, in which the respective surge current detection devices 30D are provided, correspond to the respective conductors 11-2, 11-3 and 11-15 as shown in FIG. 1, and each of the three circuit-connection conductors 11D is formed as a plate-like elongated conductor, as shown in FIG. 24. A slit 13 having a gap G is formed in the plate-like elongated conductor 11D as a detection area for a surge current "i", as best shown in FIG. 25. The slit 13 functions as a magnetic flux concentration section in which a magnetic flux M defining a magnetic field H generated by the surge current "i" flowing through the plate-like elongated conductor 11D is concentrated at a high density. The slit 13 is defined by a linear portion 13a perpendicularly extending with respect to the flowing direction of the surge current "i", and a circular indicator portion 13b communicated with the inner end of the linear portion 13a and disposed at a center of a width of the plate-like elongated conductor 11D.

A ferromagnetic material sheet 50, which is similar to that of the first embodiment, is adhered and fixed to the plate-like elongated conductor 11D with a suitable adhesion agent or the like so as to be positioned above the detection area defined by the slit 13. Namely, in the fifth embodiment, the surge current detection device 30D comprises the plate-like elongated conductor 11D having the slid 13, and the ferromagnetic material sheet 50 mounted on the plate-like elongated conductor 11D so as to be positioned above the slit 13. As shown in FIG. 24, an observation window 71 for observing a transparent protective film 53 of the ferromagnetic material sheet 50 is formed in a top wall of the housing 70 of the protector 10D.

Operation of the Fifth Embodiment

In the surge current detection device 30D provided in the plate-like elongated conductor 11D shown in FIGS. 24 and 25, when a surge current "i" flows into the plate-like elongated conductor 11D, a magnetic field H is generated around the plate-like elongated conductor 11D, and a magnetic flux M defining the magnetic field H is uniformly produced around the plate-like elongated conductor 11D. Thus, by the slit 13 defining the gap G, the magnetic flux M, which is uniformly produced around the conductor 11, is concentrated in the gap G defining the detection area, especially the circular indicator portion 13b of the slit 13, at a high density. Accordingly, a circular detection result corresponding to the circuit indicator portion 13b of the slit 13 appears on the transparent protective film 53 of the ferromagnetic material sheet 50 of FIGS. 4, 5 and 6, and thus it is possible to clearly observe a variation of the orientation state of the magnetic particles 52a1 through the observation window 71 formed in the top wall of the housing 70 of the protector 10D.

Advantage of the Fifth Embodiment

According to the fifth embodiment of the present invention, it is possible to visually and clearly recognize the variation of the orientation state of the magnetic particles 52a1 even if a time of the penetration of the surge current "i" into the plate-like elongated conductor 11D is small, and thus it is possible to simply and surely detect the magnitude of the surge current and the frequency of the surge current penetrations.

Especially, in the surge current detection device 30D according to the fifth embodiment of the present invention, since the magnetic flux concentration section is formed of a part of the plate-like elongated conductor 11D, it is possible to reduce a number of parts of the surge current detection device 30D, and thus the surge current detection device 30D can be easily downsized and compactly installed in the protector 10D. Also, it is possible to obtain similar advantages to those as stated in Items (2) and (3) in the first embodiment.

Modifications of the Fifth Embodiment

Figure 26:
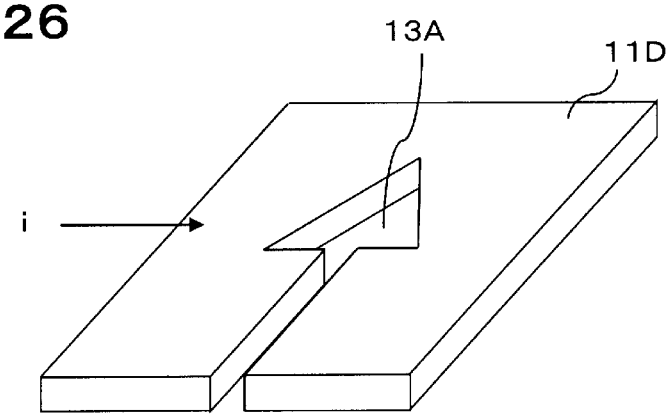
FIG. 26 is a respective perspective view showing a modification of a slit shown in FIG. 25.
Figure 27:
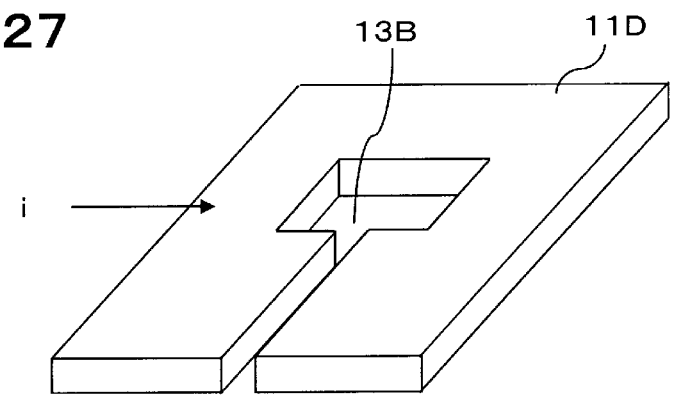
FIG. 27 is a respective perspective view showing another modification of the slit shown in FIG. 25.
Figure 28:
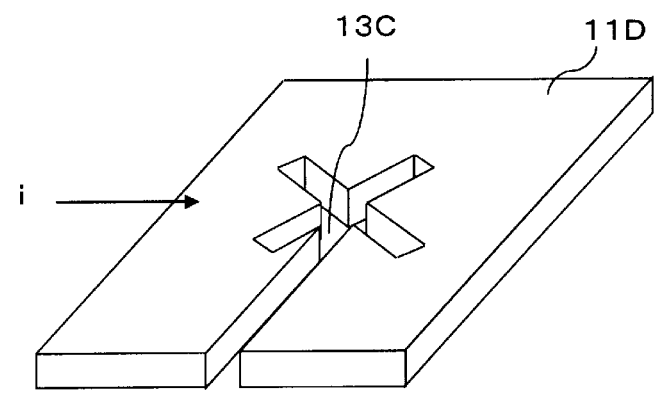
FIG. 28 is a respective perspective view showing yet another modification of the slit shown in FIG. 25.

The surge current detection device 30D according to the fifth embodiment of the present invention may be modified as stated in the following Items (a) and (b):

(a) The slit 13 of FIG. 25 may be variously modified as shown in FIGS. 26, 27 and 28. FIG. 26 is a respective perspective view showing a modification of the slit 13 shown in FIG. 25; FIG. 27 is a respective perspective view showing another modification of the slit 13 shown in FIG. 25; and FIG. 28 is a respective perspective view showing yet another modification of the slit 13 shown in FIG. 25.

1) In the modification shown in FIG. 26, a slit 13A is formed in the plate-like elongated conductor 11D as a substitute for the slit 13. The slit 13A is defined by a linear portion perpendicularly extending with respect to a flowing direction of a surge current "i", and a triangular indicator portion communicated with an inner end of the linear portion and disposed at the center of the width of the plate-like elongated conductor 11D. In this case, a generally triangular detection result appears on the front surface of the ferromagnetic material sheet 50.

2) In the modification shown in FIG. 27, a slit 13B is formed in the plate-like elongated conductor 11D as a substitute for the slit 13. The slit 13B is defined by a linear portion perpendicularly extending with respect to a flowing direction of a surge current "i", and a rectangular indicator portion communicated with an inner end of the linear portion and disposed at the center of the width of the plate-like elongated conductor 11D. In this case, a generally rectangular detection result appears on the front surface of the ferromagnetic material sheet 50.

3) In the modification shown in FIG. 28, a slit 13C is formed in the plate-like elongated conductor 11D as a substitute for the slit 13. The slit 13C is defined by a linear portion perpendicularly extending with respect to a flowing direction of a surge current "i", and a cross-shaped indicator portion communicated with an inner end of the linear portion and disposed at the center of the width of the plate-like elongated conductor 11D. In this case, a generally cross-shaped detection result appears on the front surface of the ferromagnetic material sheet 50.

In the surge current detection devices 30D featured by the slits 13A, 13B and 13C, it is possible to obtain similar advantages to those obtained from the slit 13 shown in FIG. 25.

(b) The housing 70 may be made of a suitable transparent material. In this case, it is possible to omit the observation window 71 from the housing 70.

Sixth Embodiment

Arrangement of the Sixth Embodiment

Figure 29:
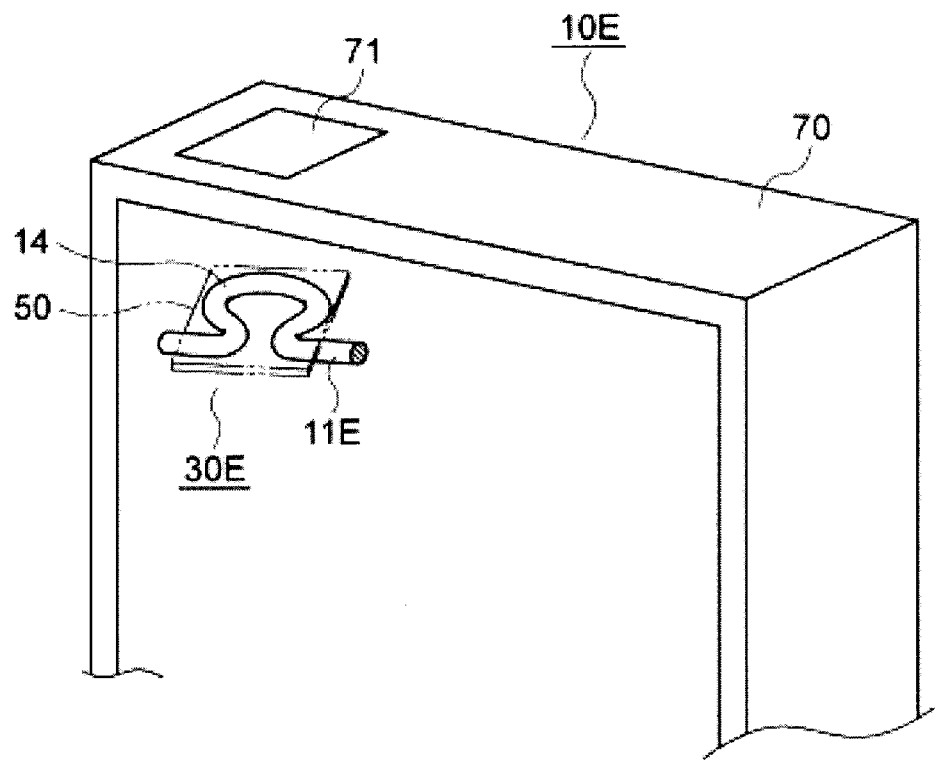
FIG. 29 is a perspective schematic view showing a part of a protector in which a surge current detection device according to a sixth embodiment of the present invention is installed.
Figure 30:
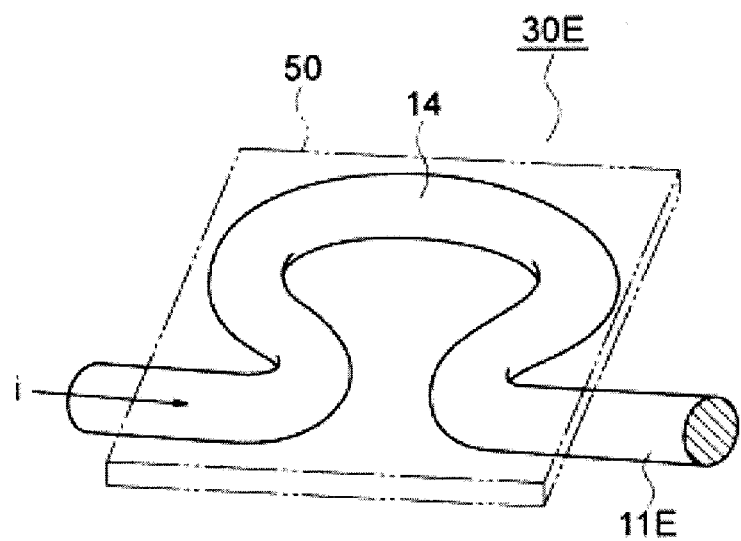
FIG. 30 is a perspective view showing the surge current detection device shown in FIG. 29.

FIG. 29 is a perspective schematic view showing a part of a protector in which a surge current detection device according to a sixth embodiment of the present invention is installed; and FIG. 30 is a perspective view showing the surge current detection device shown in FIG. 29. In these drawings, the same references as in FIGS. 2 and 3 showing the first embodiment indicate the same or corresponding elements.

Similar to the protector 10D in the fifth embodiment, a protector 10E according to the sixth embodiment of the present invention is to protect a piece of equipment 25 to be protected (FIG. 1), such as a piece of communication equipment and so on, from a surge current caused by a thunderbolt and so on. The protector 10E includes a housing 70 which houses line terminals L1 and L2, an earth terminal E, equipment terminals T1 and T1 and an arrester 12, which are similar to those of the first embodiment of FIG. 1. The housing 70 further houses a plurality of circuit-connection conductors 11E (only one of which is illustrated in FIG. 29) which are different in configuration from the plate-like elongated conductors 11D as shown in FIGS. 24 and 25, and surge current detection devices 30E (only one of which is illustrated in FIG. 29) which are different in construction from the surge current detection devices 30D as shown in FIGS. 24 and 25.

In this sixth embodiment, some of the circuit-connection conductors 11E, in which the respective surge current detection devices 30E are provided, (these conductors corresponding to the respective conductors 11-2, 11-3 and 11-15 as shown in FIG. 1) are formed as cable-like conductors which are similar to those of the first embodiment, as shown in FIGS. 29 and 30. A part of the cable-like conductor 11E is deformed into a curved-line portion 14 having a generally circle-like shape as a detection area for a surge current "i", as shown in FIGS. 29 and 30. The curved-line portion 14 functions as a magnetic flux concentration section in which a magnetic flux M, defining a magnetic field H generated by the surge current "i" flowing through the plate-like elongated conductor 11E, is concentrated at a high density.

A ferromagnetic material sheet 50, which is similar to that of the first embodiment, is mounted on the curved-line portion 14 defining the detection area by adhering and fixing the rear surface of the ferromagnetic material sheet 50 to the curved-line portion 14 with a suitable adhesion agent or the like. Similar to the fifth embodiment, as shown in FIG. 29, an observation window 71 for observing a transparent protective film 53 of the ferromagnetic material sheet 50 is formed in a top wall of the housing 70 of the protector 10E.

Operation of the Sixth Embodiment

In the surge current detection device 30E provided in the curved-line portion 14 of the cable-like conductor 11E shown in FIGS. 29 and 30, when a surge current flows into the cable-like conductor 11E, a magnetic field H is generated around the cable-like conductor 11E, and a magnetic flux M defining the magnetic field H is uniformly produced around the cable-like conductor 11E. Thus, the magnetic flux M, which is uniformly produced around the conductor 11E, is concentrated in the curved-line portion 14 at a high density. Accordingly, a circular detection result corresponding to the curved-line portion 14 appears on the transparent protective film 53 of the ferromagnetic material sheet 50 shown in FIGS. 4, 5 and 6, and thus it is possible to clearly observe a variation of the orientation state of the magnetic particles 52a1 through the observation window 71 formed in the top wall of the housing 70 of the protector 10E.

Advantage of the Fifth Embodiment

According to the sixth embodiment of the present invention, similar to the fifth embodiment, it is possible to visually and clearly recognize the variation of the orientation state of the magnetic particles 52a1 even if a time of the penetration of the surge current "i" into the cable-like conductor 11E is small, and thus it is possible to simply and surely detect the magnitude of the surge current and the frequency of the surge current penetrations.

Especially, in the surge current detection device 30E according to the sixth embodiment of the present invention, since the magnetic flux concentration section is formed by utilizing the cable-like conductor 11E provided in the protector 10E, i.e., since the magnetic flux concentration section is formed by deforming and shaping a part of a usual cable-like conductor, similar to the fifth embodiment, it is possible to reduce a number of parts of the surge current detection device, and thus the surge current detection device 30E can be easily downsized and compactly installed in the protector 10E.

Modifications of the Fifth Embodiment

Figure 31:
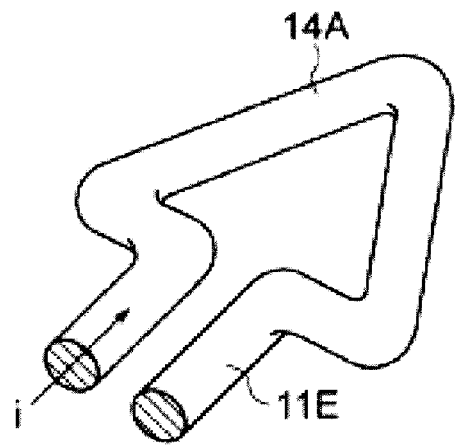
FIG. 31 is a respective perspective view showing a modification of a curved-line portion shown in FIG. 30.
Figure 32:
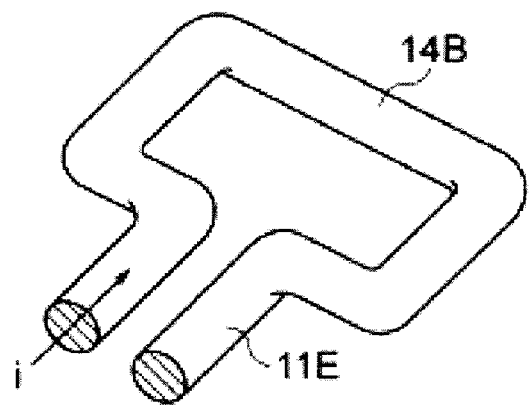
FIG. 32 is a respective perspective view showing another modification of the curved-line portion shown in FIG. 30.
Figure 33:
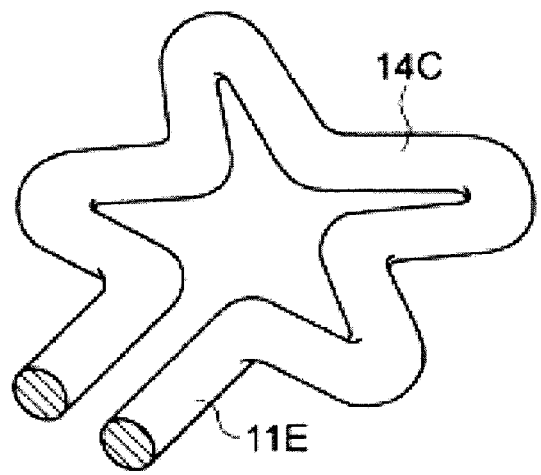
FIG. 33 is a respective perspective view showing yet another modification of the curved-line portion shown in FIG. 30.

The surge current detection device 30E according to the sixth embodiment of the present invention may be modified as stated in the following Item (a):

(a) The curved-line portion 14 of FIGS. 29 and 30 may be modified as shown FIGS. 31, 32 and 33. FIG. 31 is a respective perspective view showing a modification of the curved-line portion 14 shown in FIG. 30; FIG. 32 is a respective perspective view showing another modification of the curved-line portion 14 shown in FIG. 30; and FIG. 33 is a respective perspective view showing yet another modification of the curved-line portion 14 shown in FIG. 30.

1) In the modification shown in FIG. 31, a part of the cable-like conductor 11E is deformed into a curved-line portion 14A having a generally triangle-like shape, as a substitute for the curved-line portion 14. In this case, a generally triangle-like detection result appears on the front surface of the ferromagnetic material sheet 50.

2) In the modification shown in FIG. 32, a part of the cable-like conductor 11E is deformed into a curved-line portion 14B having a generally rectangle-like shape, as a substitute for the curved-line portion 14. In this case, a generally rectangle-like detection result appears on the front surface of the ferromagnetic material sheet 50.

3) In the modification shown in FIG. 33, a part of the cable-like conductor 11E is deformed into a curved-like portion 14C having a generally star-like shape, as a substitute for the curved-like portion 14. In this case, a generally star-like detection result appears on the front surface of the ferromagnetic material sheet 50.

Seventh Embodiment

FIG. 34, FIG. 36, FIG. 38 and FIG. 40 are respective circuit diagrams according to a seventh embodiment of the present invention to explain operations of other examples of the circuit diagram of the protector of FIG. 1 in a ground-to-line mode (i.e., a common mode). Also, FIG. 35, FIG. 37, FIG. 39 and FIG. 41 are the respective circuit diagrams according to the seventh embodiment of the present invention to explain operations of other examples of the circuit diagram of the protector of FIG. 1 in a line-to-line mode (i.e., a normal mode). Note, in these drawings, the same references as in FIGS. 2 and 3 showing the first embodiment indicate the same or corresponding elements.

A protector, in which each of the surge current detection devices 30A to 30E according the first, second, third, fourth, fifth and sixth embodiment should be installed, is not limited to only the protector of FIG. 1. Namely, each of the surge current detection devices 30A to 30E may be used in a variety of protector circuits. To simplify explanations, other examples of the protector circuit, in which the surge current detection device 30 of the first embodiment can be installed, will now be explained below.

Figure 34:
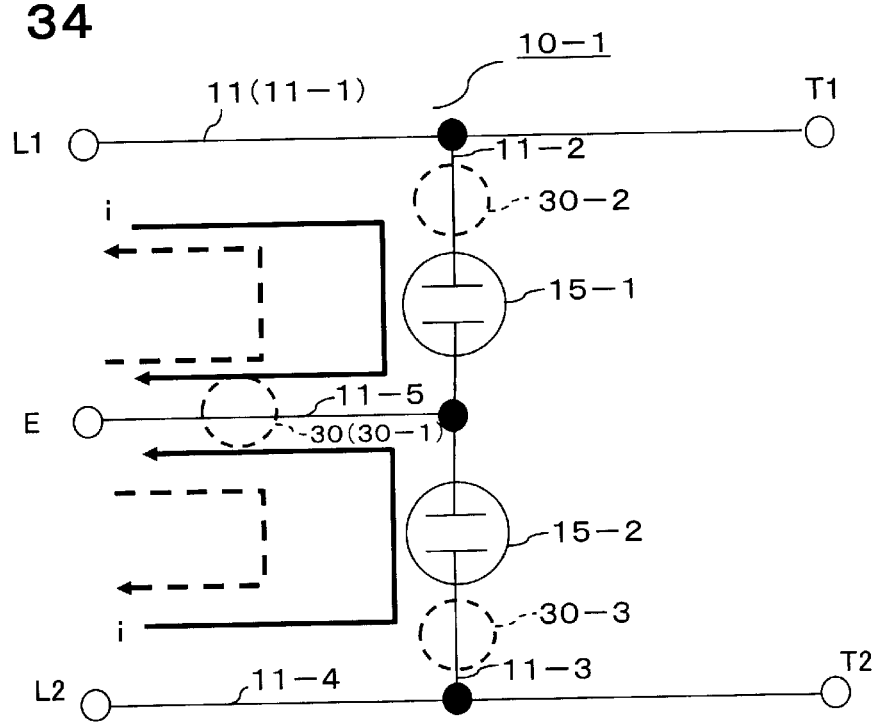
FIG. 34 is another example of the circuit diagram of the protector of FIG. 1, according to a seventh embodiment of the present invention, for explaining an operation of the example concerned in a ground-to-line mode (i.e., a common mode)
Figure 35:
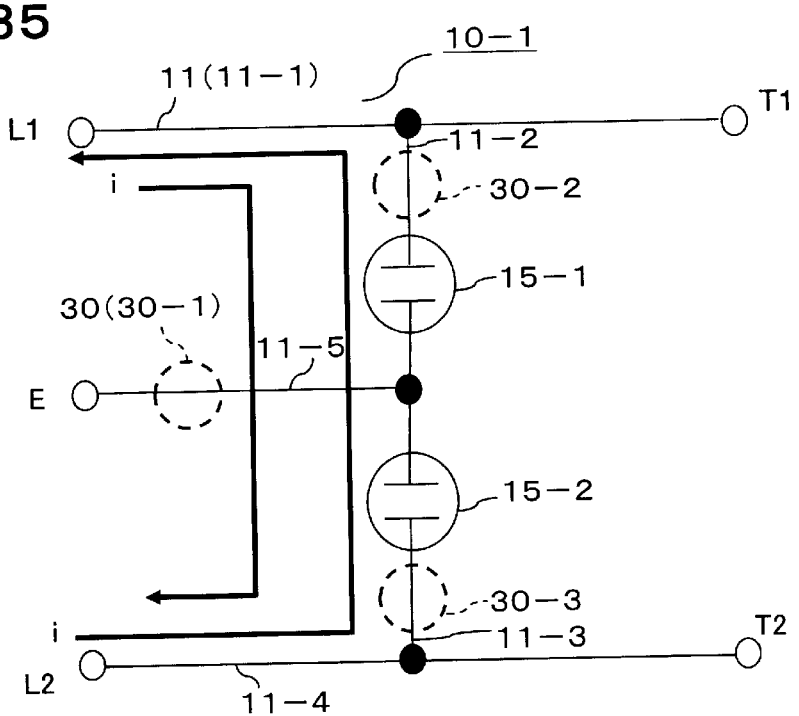
FIG. 35 is the circuit diagram of FIG. 34 for explaining an operation of the example concerned in a line-to-line mode (i.e., a normal mode)

(Protector of FIGS. 34 and 35)

The protector 10-1 shown in FIGS. 34 and 35 includes: two 2-pole arresters 15-1 and 15-2; three surge current detection devices 30-1, 30-2 and 30-3 similar to those of the first embodiment; and a plurality of conductors 11-1 to 11-5. The 2-pole arresters 15-1 and 15-2 are connected in series to each other between a conductor 11-1 connected to a line terminal L1 and an equipment terminal T1 and a conductor 11-4 connected to a line terminal L2 and an equipment terminal T2, using the conductors 11-2 and 11-3, and a conductor between the 2-pole arresters 15-1 and 15-2 is connected to an earth terminal E through the intermediary of the conductor 11-5. The surge current detection device 30-1, 30-2 and 30-3 are provided on the conductor 11-5, the conductor 11-2 and the conductor 11-3, respectively.

In a ground-to-line mode (i.e., a common mode) of FIG. 34, when respective surge currents "i" penetrated into the line terminals L1 and L2 featuring a positive polarity, the 2-pole arresters 15-1 and 15-2 perform a discharging operation due to an abnormal voltage. Thus, the surge currents "i" penetrated into the line terminals L1 and L2 flow into an earth terminal E, as indicated by the two solid arrows in FIG. 34, respectively. Thus, the piece of equipment 25 of FIG. 1, which is connected to the equipment terminals T1 and T2, can be protected from the surge currents "i". While the surge currents "i" flow, the surge current detection devices 30-1, 30-2 and 30-3 are operated.

On the other hand, when respective surge currents "i" penetrated into the line terminals L1 and L2 feature a negative polarity, the 2-pole arresters 15-1 and 15-2 perform a discharging operation due to an abnormal voltage. Thus, the surge currents "i" penetrated into the earth terminal E flows into the line terminals L1 and L2 in reverse order, as indicated by the two broken arrows in FIG. 34, respectively. Thus, the piece of equipment 25 of FIG. 1, which is connected to the equipment terminals T1 and T2, can be protected from the surge currents "i". While the surge current "i" flows, the surge current detection devices 30-1, 30-2 and 30-3 are operated so that it is possible to detect the penetration of the surge current "i" in a similar manner to the first embodiment.

In a line-to-line mode (i.e., a normal mode) of FIG. 35, when a surge current "i" featuring a positive polarity is penetrated into the line terminal L1, the 2-pole arresters 15-1 and 15-2 perform a discharging operation due to an abnormal voltage. Thus, the penetrated surge current "i" flows from the line terminal L1 into the line terminal L2 through the intermediary of the conductor 11-1, the conductor 11-2 on which the surge current detection device 30-2 is provided, the 2-pole arrester 15-1, the conductor between the 2-pole arresters 15-1 and 15-2, the 2-pole arrester 15-2, the conductor 11-3 on which the surge current detection device 30-3 is provided, and the conductor 11-4, as indicated by the leftmost one of the two solid arrows in FIG. 35. Thus, the piece of equipment 25 connected to the equipment terminals T1 and T2 can be protected from the surge currents "i". In this case, since the surge current "i" does not flow into the earth terminal E, only the surge current detection devices 30-2 and 30-3 are operated so that it is possible to detect the penetration of the surge current "i" in a similar manner to the first embodiment.

On the other hand, when a surge current "i" featuring a positive polarity is penetrated into the line terminal L2, the 2-pole arresters 15-1 and 15-2 perform a discharging operation due to an abnormal voltage. Thus, the penetrated surge current "i" flows from the line terminal L2 into the line terminal L1 in reverse order, as indicated by the other solid arrow in FIG. 35. Thus, the piece of equipment 25 connected to the equipment terminals T1 and T2 can be protected from the surge currents "i". In this case, since the surge current "i" does not flow into the earth terminal E, only the surge current detection devices 30-2 and 30-3 are operated so that it is possible to detect the penetration of the surge current "i" in a similar manner to the first embodiment.

Figure 36:
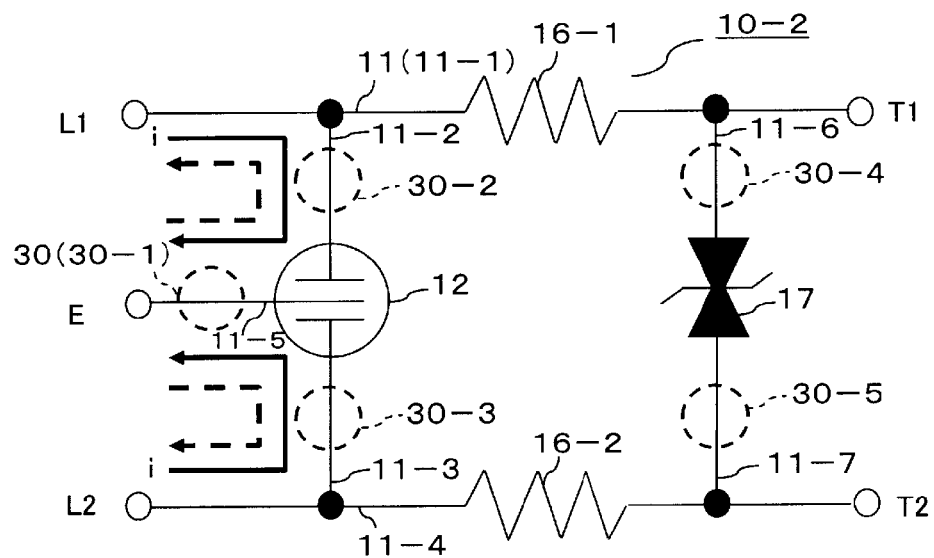
FIG. 36 is yet another example of the circuit diagram of the protector of FIG. 1, according to the seventh embodiment of the present invention, for explaining an operation of the example concerned in a ground-to-line mode (i.e., a common mode)
Figure 37:
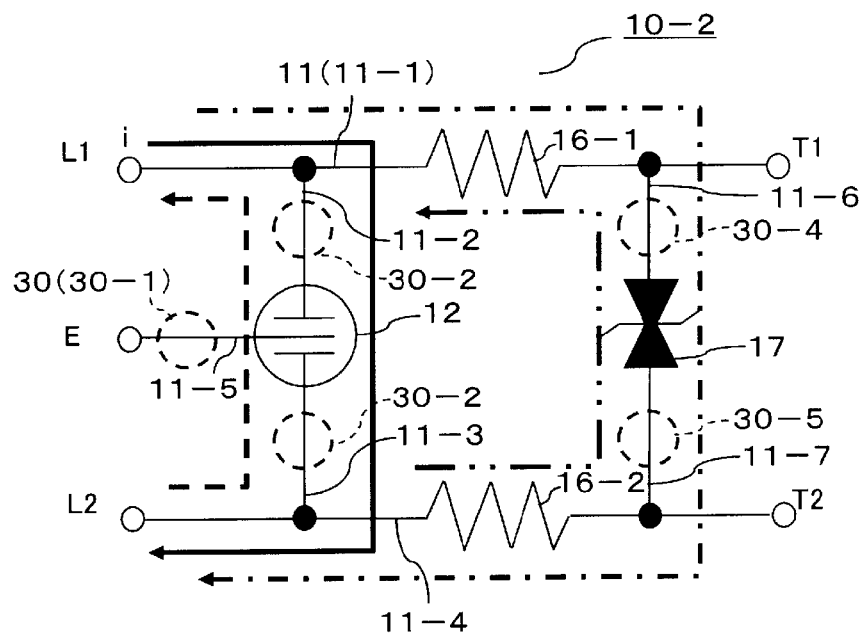
FIG. 37 is the circuit diagram of FIG. 36 for explaining an operation of the example concerned in a line-to-line mode (i.e., a normal mode)

(Protector of FIGS. 36 and 37)

The protector 10-2 shown in FIGS. 36 and 37 includes a circuit having a Zener diode 17 by which a line-to-line voltage is absorbed. Also, the protector 10-2 includes a 3-pole arrester 12, two resistors 16-1 and 16-2, five surge current detection devices 30-1 to 30-5, and conductors 11-1 to 11-7, with each of the five surge current detection devices 30-1 to 30-5 being similar to that of the first embodiment. The conductor 11-1 is connected to a first electrode of the 3-pole arrester 12 through the intermediary of the conductor 11-2, and a second electrode of the 3-pole arrester 12 is connected to the conductor 11-4 through the intermediary of the conductor 11-3. A third electrode of the 3-pole arrester 12 is connected to an earth terminal E through the intermediary of the conductor 11-5. The resistor 16-1 is provided in the conductor 11-1 in series, and the resistor 16-2 is provided in the conductor 11-4 in series. The Zener diode 17 is connected between the conductor 11-1 and 11-4 in series through the intermediary of the conductors 11-6 and 11-7. The respective surge current detection devices 30-1, 30-2, 30-3, 30-4 and 30-5 are provided on the conductor 11-5, 11-2, 11-3, 11-6 and 11-7.

In a ground-to-line mode (i.e., a common mode) of FIG. 36, surge currents "i" penetrated into the respective line terminals L1 and L2 flow into the earth terminal E, as indicated by the two solid arrow in FIG. 36, respectively, and thus the surge current detection devices 30-1, 30-2 and 30-3 are operated so that it is possible to detect the penetration of the surge current "i" in a similar manner to the first embodiment.

On the other hand, a surge current "i" penetrated into the earth terminal E flows into the line terminals L1 and L2, as indicated by the broken arrows in FIG. 36, respectively, and thus the surge current detection devices 30-1, 30-2 and 30-3 are operated so that it is possible to detect the penetration of the surge current "i" in a similar manner to the first embodiment.

In a line-to-line mode (i.e., a normal mode) of FIG. 37, when a surge current "i" featuring a positive polarity is penetrated into the line terminal L1 by a thunderbolt and so on, once the surge current "i" flows into the line terminal L2 through the intermediary of the conductor 11-1, the resistor 16-1, the conductor 11-6, the Zener diode 17, the conductor 11-7, the resistor 16-2 and the conductor 11-4, as indicated by the one-dotted chain arrow in FIG. 37. Nevertheless, when voltages generated in the resistors 16-1 and 16-2 by the surge current "i" exceeds an operation voltage of the 3-pole arrester 12, the surge current "i" flows into from the line terminal L1 into the line terminal L2 through the conductor 11-1, the 3-pole arrester 12, the conductor 11-3 and the conductor 11-4, as indicated by the solid arrow in FIG. 37. Thus, the surge current detection devices 30-2, 30-3, 30-4 and 30-5 are operated so that it is possible to detect the penetration of the surge current "i" in a similar manner to the first embodiment.

On the other hand, when a surge current "i" featuring a positive polarity is penetrated into the line terminal L2 by a thunderbolt and so on, the Zener diode 17 first responds to the penetration of the surge current "i" into the line terminal L2 so that the surge current "i" flows from the line terminal L2 into the line terminal L1, as indicated by the double-dotted chain arrow in FIG. 37. After a given time has elapsed, the surge current "i" flows from the line terminal L2 into the line terminal L1, as indicated by the broken arrow in FIG. 37. Thus, similar to the case of the positive polarity, the surge current detection devices 30-2, 30-3, 30-4 and 30-5 are operated so that it is possible to detect the penetration of the surge current "i" in a similar manner to the first embodiment.

Figure 38:
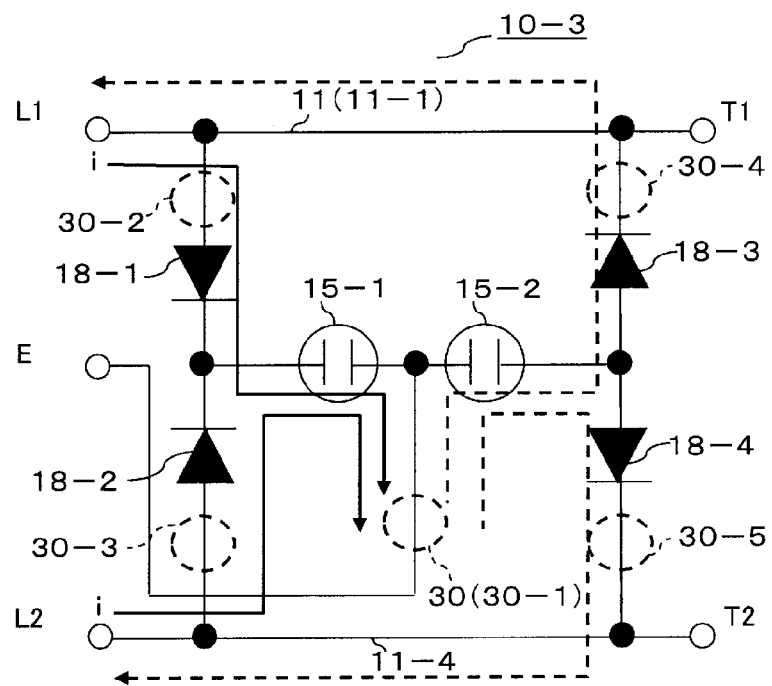
FIG. 38 is still yet another example of the circuit diagram of the protector of FIG. 1, according to the seventh embodiment of the present invention, for explaining an operation of the example concerned in a ground-to-line mode (i.e., a common mode)
Figure 39:
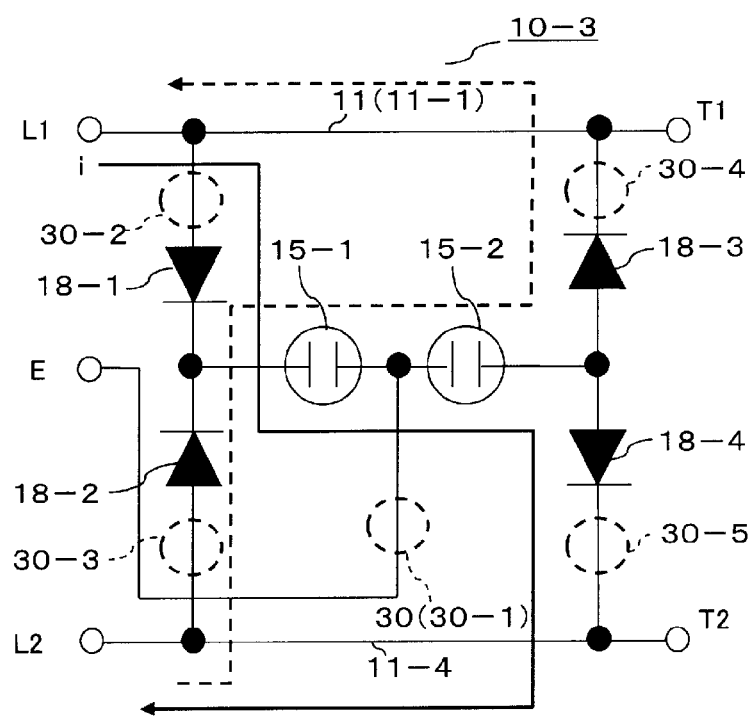
FIG. 39 is the circuit diagram of FIG. 38 for explaining an operation of the example concerned in a line-to-line mode (i.e., a normal mode)

(Protector of FIGS. 38 and 39)

The protector 10-3 shown in FIGS. 38 and 39 includes two 2-pole arresters 15-1 and 15-2, four diodes 18-1 to 18-4, five surge current detection devices 30-1 to 30-5, and a plurality of conductors by which these elements are suitably connected to each another. Each of the five surge current detection devices 30-1 to 30-5 is similar to that of the first embodiment. Also, in the protector 10-3, a line terminal L1 and an equipment terminal T1 are connected to each other by a conductor 11-1, and a line terminal L2 and an equipment terminal T2 are connected to each other by a conductor 11-4. The surge current detection device 30-2, the forwardly-oriented diode 18-1, the reversely-oriented diode 18-2 and the surge current detection device 30-3 are connected in series between the line terminal L1 and the line terminal L2. The surge current detection device 30-4, the reversely-oriented diode 18-3, the forwardly-oriented diode 18-4 and the surge current detection device 30-5 are connected in series between the equipment terminal T1 and the equipment terminal T2. As shown in FIGS. 38 and 39, the 2-pole arresters 15-1 and 15-2 are connected in series to each other between the conductor connected to the forwardly-oriented diode 18-1 and the reversely-oriented diode 18-2 and the conductor connected to the reversely-oriented diode 18-3 and the forwardly-oriented diode 18-4, and the conductor connected to the 2-pole arresters 15-1 and 15-2 is connected to an earth terminal E through the intermediary of the surge current detection device 30-1.

In a ground-to-line mode (i.e., a common mode) of FIG. 38, when surge currents "i" featuring a positive polarity are penetrated into the respective line terminals L1 and L2, these surge currents "i" flow into the earth terminal E, as indicated by the two solid arrow in FIG. 38, respectively. Thus, when the surge currents "i" feature the positive polarity, the surge current detection devices 30-1, 30-2 and 30-3 are operated so that it is possible to detect the penetration of the surge currents "i" in a similar manner to the first embodiment. On the other hand, when a surge current "i" featuring a negative polarity is penetrated into the earth terminal E, the surge current "i" concerned flows into the line terminals L1 and L2, as indicated by the two broken arrows in FIG. 38. Thus, when the surge currents "i" feature the negative polarity, the surge current detection devices 30-1, 30-4 and 30-5 are operated so that it is possible to detect the penetration of the surge current "i" in a similar manner to the first embodiment.

In a line-to-line mode (i.e., a normal mode) of FIG. 39, when a surge current "i" featuring a positive polarity is penetrated into the line terminal L1, the surge current "i" flows from the line terminal L1 into the line terminal L2, as indicated by the solid arrow in FIG. 39. Thus, when the line terminal L1 exhibits the positive polarity, the surge current detection devices 30-2 and 30-5 are operated so that it is possible to detect the penetration of the surge current "i" in a similar manner to the first embodiment.

On the other hand, when a surge current "i" featuring a positive polarity is penetrated into the line terminal L2, the surge current "i" flows from the line terminal L2 into the line terminal L1, as indicated by the broken arrow in FIG. 39. Thus, when the line terminal L2 exhibits the positive polarity, the surge current detection devices 30-3 and 30-4 are operated so that it is possible to detect the penetration of the surge current "i" in a similar manner to the first embodiment. (Protector of FIGS. 40 and 41)

Figure 40:
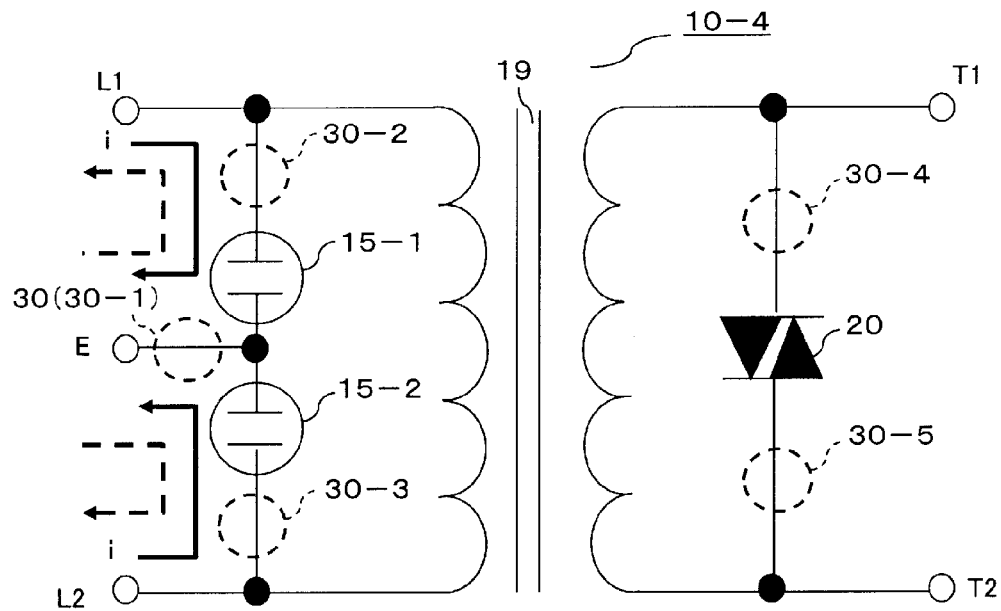
FIG. 40 is still yet another example of the circuit diagram of the protector of FIG. 1, according to the seventh embodiment of the present invention, for explaining an operation of the example concerned in a ground-to-line mode (i.e., a common mode)
Figure 41:
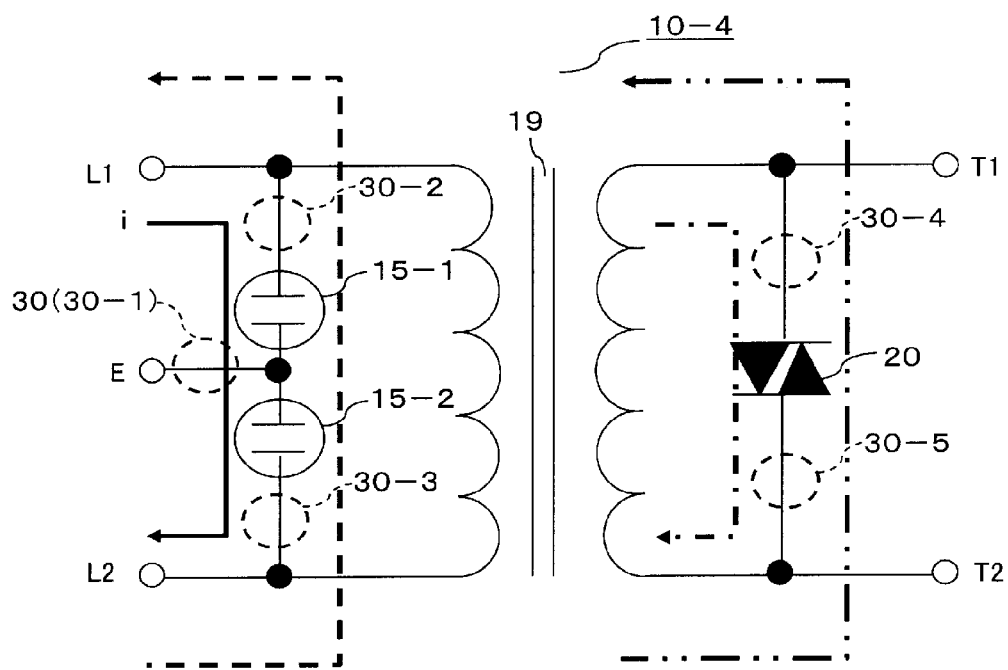
FIG. 41 is the circuit diagram of FIG. 40 for explaining an operation of the example concerned in a line-to-line mode (i.e., a normal mode).

The protector 10-4 shown in FIGS. 40 and 41 includes a circuit having an isolation transformer 19 by which a piece of equipment to be protected is isolated from a ground-to-line voltage, a diode varistor 20 by which a line-to-line voltage is absorbed, two 2-pole arresters 15-1 and 15-1, five surge current detection devices 30-1 to 30-5, and a plurality of conductors by which these elements are suitably connected to each another. Each of the five surge current detection devices 30-1 to 30-5 is similar to that of the first embodiment.

In a ground-to-line mode (i.e., a common mode) of FIG. 40, when surge currents "i" are penetrated into respective line terminals L1 and L2, these surge currents "i" flow into an earth terminal E, as indicated by the two solid arrows in FIG. 40, respectively, and thus the surge current detection devices 30-1, 30-2 and 30-3 are operated so that it is possible to detect the penetration of the surge currents "i" in a similar manner to the first embodiment.

On the other hand, when a surge current "i" is penetrated into the earth terminal E, the surge current "i" flows into the line terminals L1 and L2, as indicated the two broken arrows in FIG. 40, and thus the surge current detection devices 30-1, 30-3 and 30-4 are operated so that it is possible to detect the penetration of the surge current "i" in a similar manner to the first embodiment.

In a line-to-line mode (i.e., a normal mode) of FIG. 41, when a surge current "i" featuring a positive polarity is penetrated into the line terminal L1, once the surge current "i" flows from the line terminal L1 into the line terminal L2 through the intermediary of the diode varistor 20, as indicated by the one-dotted arrow in FIG. 41. After a given time has elapsed, the surge current "i" flows from the line terminal L1 into the line terminal L2 through the intermediary of the arresters 15-1 and 15-2, as indicated by the solid arrow in FIG. 41. Thus, the surge current detection devices 30-2, 30-3, 30-4 and 30-5 are operated so that it is possible to detect the penetration of the surge current "i" in a similar manner to the first embodiment.

On the other hand, when a surge current "i" featuring a positive polarity is penetrated into the line terminal L2, the diode varistor 20 first responds to the penetration of the surge current "i" into the line terminal L2 so that the surge current "i" flows from the line terminal L2 into the line terminal L1 through the intermediary of the diode varistor 20, as indicated by the double-dotted arrow in FIG. 41. After a given time has elapsed, the surge current "i" flows from the line terminal L2 into the line terminal L1 through the intermediary of the arresters 15-1 and 15-2, as indicated by the broken arrow in FIG. 41. Thus, the surge current detection devices 30-2, 30-3, 30-4 and 30-5 are operated so that it is possible to detect the penetration of the surge current "i" in a similar manner to the first embodiment.

Finally, it will be understood by those skilled in the art that the foregoing description is of preferred embodiments of the method and the device, and that various changes and modifications may be made to the present invention without departing from the spirit and scope thereof.

What is claimed is:

1. A surge current detection device that is provided on a conductor connected to a protection element for protecting a piece of equipment to be protected from a surge current penetrated into said conductor, and that is adapted to detect the penetration of the surge current into the conductor, which device comprises:

a magnetic flux concentration section that concentrates a magnetic flux, which defines a magnetic field generated by the surge current penetrated into said conductor, in a given detection area at a high density; and a ferromagnetic material sheet disposed over said detection area, wherein said ferromagnetic material sheet comprises:

a sheet member having a rear surface and a front surface and disposed over said detection area so that the rear surface thereof is applied to said detection area;

a recording layer provided on the front surface of the said sheet member and including a plurality of microcapsules, each of which contains a suitable liquid, and a plurality of magnetic particles suspended in said liquid, an orientation state of the magnetic particles varying according to the concentrated magnetic flux, whereby a penetration state of the surge current can be recorded and erased in said recording layer; and a transparent protective film covering said recording layer so that a recording state and an erasing state in said recording layer can be visually recognized.

2. The surge current detection device as set forth in claim 1, wherein said magnetic flux concentration section has a slit-like gap defining said detection area, and is formed as a magnetic flux concentration member which is made of a generally-cylindrical ferromagnetic material having either a monolithic structure or a two-divided structure to hold the conductor having a cable-like configuration.

3. The surge current detection device as set forth in claim 1, wherein said magnetic flux concentration section is formed as said conductor having a plate-like configuration and having a slit-like gap which is defined as said detection area, and wherein the rear surface of said sheet member is fixed to a location of said detection area.

4. The surge current detection device as set forth in claim 1, wherein said magnetic flux concentration section is formed as said conductor having cable-like configuration and having a curved-line portion defining said detection area, and wherein the rear surface of said sheet member is fixed to a location of said curved-line portion.

5. The surge current detection device as set forth in claim 2, further comprising a holder by which said magnetic flux concentration member is held, and to which said ferromagnetic material sheet is securely attached so as to be opposed to said detection area of said magnetic flux concentration member.

6. The surge current detection device as set forth in claim 5, wherein said holder comprises:
   a holder portion for fixing and holding said magnetic flux concentration member; and
   an attachment portion that is positioned so as to be opposed to said gap of said magnetic flux concentration member, said sheet member of said ferromagnetic material sheet being fixed to said attachment portion.

7. The surge current detection device as set forth in claim 6, wherein an opening, through which a magnetic flux passes, is formed in said attachment portion of said holder.

8. The surge current detection device as set forth in claim 5, wherein said holder comprises:
   a holder portion for fixing and holding said magnetic flux concentration member;
   an attachment portion that is positioned so as to be opposed to said gap of said magnetic flux concentration member, said sheet member of said ferromagnetic material sheet being fixed to said attachment portion; and
   a hinge portion by which said attachment portion is joined to said holder portion so that said attachment portion is movable between a closed position and an opened position.

9. The surge current detection device as set forth in claim 8, wherein an opening, through which a magnetic flux passes, is formed in said attachment portion of said holder.

10. The surge current detection device as set forth in claim 1, wherein said protection element and the surge current detection device are housed in a housing of a protector, and wherein an observation window for observing said transparent protective film of said ferromagnetic material sheet is formed in a wall of said housing.

* * * * *